(12) United States Patent
Tropp

(10) Patent No.: US 6,535,084 B1
(45) Date of Patent: Mar. 18, 2003

(54) METHOD AND APPARATUS FOR DESIGNING AN RF COIL ASSEMBLY

(75) Inventor: James S. Tropp, Berkeley, CA (US)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 80 days.

(21) Appl. No.: 09/748,967

(22) Filed: Dec. 27, 2000

Related U.S. Application Data

(60) Provisional application No. 60/176,453, filed on Jan. 15, 2000.

(51) Int. Cl.$^7$ .............................. G01V 3/00; H01P 7/00
(52) U.S. Cl. ..................... 333/219; 324/318; 324/322
(58) Field of Search ................... 324/318, 322, 324/300, 312, 308, 307, 309; 333/219

(56) References Cited

U.S. PATENT DOCUMENTS

| | | | | |
|---|---|---|---|---|
| 4,580,219 A | | 4/1986 | Pelc et al. .................. 364/414 |
| 4,692,705 A | * | 9/1987 | Hayes ......................... 324/318 |
| 4,694,255 A | * | 9/1987 | Hayes ......................... 324/318 |
| 4,746,866 A | | 5/1988 | Röschmann ................ 324/318 |
| 4,751,464 A | | 6/1988 | Bridges ....................... 324/318 |
| 5,045,792 A | * | 9/1991 | Mehdizadeh ................ 324/318 |
| 5,053,711 A | * | 10/1991 | Hayes et al. ................ 324/318 |
| 5,196,797 A | * | 3/1993 | Tropp .......................... 324/322 |
| 5,557,247 A | | 9/1996 | Vaughn, Jr. ................. 333/219 |
| 5,886,569 A | | 3/1999 | Mitsuishi .................... 327/540 |
| 6,232,779 B1 | * | 5/2001 | Tropp et al. ................. 324/322 |
| 6,285,189 B1 | * | 9/2001 | Wong .......................... 324/318 |

OTHER PUBLICATIONS

J. Thomas Vaughan et al., *High Frequency Volume Coils for Clinical NMR Imaging and Spectroscopy*, MRM vol. 32, pp. 206–218, Williams & Wilkins, 1994.

James Tropp, *Mutual Inductance in the Bird–Cage Resonator*, Journal of Magnetic Resonance, vol. 126, pp. 9–17, Academic Press, 1997.

Smythe, *Static and Dynamic Electricity*, Chapter IV, 3$^{rd}$ edition, McGraw–Hill, New York, 1968, pp. 63–105.

* cited by examiner

*Primary Examiner*—Robert Pascal
*Assistant Examiner*—Dean Takaoka
(74) *Attorney, Agent, or Firm*—Carl B Horton

(57) ABSTRACT

A method and system for designing a radio frequency (RF) coil assembly is disclosed herein. The designing scheme or tool includes determining a self inductance by solving analytically or numerically two-dimensional boundary value problems s. The scheme further includes determining at least one mutual inductance by solving analytically or numerically the two-dimensional boundary value problems. The ratio of the mutual inductance and the self inductance represents a magnetic coefficient of coupling of the RF coil assembly.

142 Claims, 6 Drawing Sheets

METHOD AND APPARATUS FOR DESIGNING AN RF COIL ASSEMBLY

CROSS-REFERENCE TO RELATED APPLICATIONS

This application claims the benefit of U.S. Provisional Patent Application No. 60/176,453 James S. Tropp, entitled "Method and Apparatus for Designing a RF Coil Assembly," filed on Jan. 15, 2000.

BACKGROUND OF THE INVENTION

The present invention relates generally to magnetic resonance (MR) imaging or spectroscopy systems. More particularly, the present invention relates to a scheme for designing a radio frequency (RF) coil assembly for transmitting and/or receiving signals in MR imaging or spectroscopy systems.

In recent years, MR imaging and spectroscopy have developed into a joint modality capable of studying relatively large sized objects of interest, such as, human anatomy. MR images depicting parameters associated with nuclear spins (for example, protons associated with water in tissue) can provide information about the amount, type, and state of various tissues in the imaging region. MR spectroscopy permits the study of chemical processes, for example, in live organisms. The use of MR to produce images and spectroscopic studies of relatively large sized objects of interest is made possible, in part, by specifically designed system components, such as, RF coil assemblies.

The MR phenomenon occurs in atomic nuclei having an odd number of protons or neutrons. Due to the spins of protons and neutrons, each nucleus associated with such a proton exhibits a magnetic moment. When an object of interest composed of such nuclei is subjected to a uniform or static magnetic field (polarizing field $B_o$, along the z direction in a Cartesian coordinate system denoted as x, y, and z), the individual magnetic moments of the spins in the nuclei tend to align with this polarizing field; but may also be made to precess about it at their characteristic Larmor frequency. The Larmor frequency, also referred to as the angular precession frequency T, is given by the Larmor equation $T=\gamma B$, where $\gamma$ is a gyromagnetic ratio characteristic of each active MR isotope and B is the magnetic field acting upon the nuclear spins (polarizing field $B_o$). Thus, the Larmor frequency is dependent on the strength of the applied static magnetic field and on the characteristics of the nuclei comprising the object of interest.

The orientation of the magnetic moments produce a net magnetization M in the direction along polarizing field $B_o$. Magnetization M, however, may be perturbed by the application of magnetic fields oscillating at or near the Larmor frequency. Such magnetic fields (referred to as an excitation field $B_1$) are applied in a direction orthogonal to the direction of polarizing field $B_o$ by means of radio frequency (RF) pulses through a coil connected to an RF transmitting apparatus. Under the influence of this RF excitation, magnetization M rotates or "flips" at a certain flipping angle in the direction of excitation field $B_1$. In MR studies, it is typically desirable to apply RF pulses of sufficient magnitude and duration to rotate or "flip" magnetization M into a plane perpendicular to the direction of polarizing field $B_o$ (i.e., into the x-y plane, also referred to as a transverse plane) to produce a net transverse magnetic moment $M_t$. When RF excitation ceases, the nuclear moments that are rotated into the transverse plane nutate back toward the direction of polarizing field $B_o$. The vector sum of the moments of individual spins forms a precessing bulk magnetization that can be sensed by an RF coil. The signals emitted by the excited spins and received by the RF coil, also referred to as MR signals, are representative of the magnetic field and the particular chemical environment in which the nuclei are situated. MR signals are then suitably processed to produce an MR image or spectrum.

When MR signals are utilized to produce MR images, magnetic field gradients ($G_x$, $G_y$, and $G_z$) are also utilized to encode spatial information into these MR signals. Typically, the object to be imaged is scanned by a sequence of measurement cycles in which these gradient waveforms vary according to the particular localization method being used. The resulting set of received MR signals are digitized and processed to reconstruct the MR image using one of well-known reconstruction techniques.

RF coils used in whole-body MR studies can be a type of RF resonators known as transverse electromagnetic (TEM) resonators. Such an TEM resonator can be configured to be an RF receiver, transmitter, or transceiver. Presently, an TEM resonator is typically an open-ended structure and is configured to accommodate therein a part or all of a patient to be studied. The TEM resonator is cylindrical in shape, although, it need not be circular in cross-section. An TEM resonator includes a plurality of identical linear antenna elements, a pair of conductive annular rings, a cylindrical conductive shield, and capacitance.

The plurality of antenna elements are disposed in cylindrical array inside the shield, the linear axes of the antenna elements parallel with the cylindrical axis of the shield. One end of all of the antenna elements are held in place by one of the annular rings and the other end of all the antenna elements are held in place by the other one of the annular rings. The annular rings (also referred to as the annuli) are positioned inside and close to the ends of the shield. A certain amount of capacitance, either lumped or distributed, is also provided by discrete capacitors placed between the ends of each of the antenna elements and the annular rings, or by the device itself, respectively. An electrical circuit is thereby formed by each of the antenna elements, the pair of annular rings, the shield, and the capacitance, in which the shield and annular rings serve as a single ground plane and the shield contains the electromagnetic field within the cavity formed by the device.

Physical dimensions associated with the TEM resonator and of the various components comprising the TEM resonator comprise the geometric parameters of the TEM resonator. To a certain extent, the geometric parameters of TEM resonators are constrained by use and system requirements. For example, the diameter of the TEM resonator, and accordingly, the diameter of the shield and annular rings, is required to be of a certain minimum dimension to accommodate an object of interest, such as, a patient. The degree of mechanical symmetry and robustness desired may also dictate some geometric parameters. Material properties or cost considerations may further dictate geometric parameters.

In addition to geometric parameter constraints, TEM resonators also have electrical requirements, such as, having to operate at a principal or useful resonant mode frequency in order to receive the MR signals emitted from the object of interest. This principal or useful resonant mode frequency (also referred to as the operating frequency) is a resonant frequency associated with the overall device and should be the same as the Larmor frequency. In practice, however, designing an TEM resonator to operate at the desired principal resonant frequency is not a simple task. The design process involves balancing and determining numerous parameters, such as, geometry, material characteristics, electrical properties, number of subcomponents, etc., that satisfy the constraints discussed above.

Accordingly, designing an TEM resonator presently involves a long and laborious process of trial and error that typically takes several weeks to complete. The design process includes deciding on the physical dimensions or geometric parameters and fully constructing a working prototype of the desired TEM resonator based thereon. Then electrical parameters associated with the working prototype are measured, especially the resonant frequencies of the device. These measured parameters are used to construct a next iteration of the working prototype. This iterative process continues till the design parameters necessary to achieve the desired principal resonant frequency have been empirically determined.

Such iterative determinations are necessary due to the complex relationship between the design parameters and because not all of the design parameters can be determined directly through numerical or analytical calculations. For example, the principal resonant mode frequency is a function of the individual resonant frequency and the interaction (i.e., mutual coupling) between the antenna elements. The individual resonant mode frequency, in turn, is a function of the capacitance associated therewith (e.g., the lumped capacitance employed at both ends of a given antenna element). Accordingly, if magnetic coefficients of coupling (which express the degree of coupling or interaction between the antenna elements) can be calculated or approximated for an TEM resonator of a given geometry and which is to be operated at a certain principal resonant frequency, the design process can be completed merely by making a relatively few capacitance adjustments, as needed, to attain the desired resonant frequency.

Thus, there is a need for an TEM resonator designing scheme that reduces the design time, and which provides, numerically or analytically, the magnetic coefficients of coupling values. There is a further need for an TEM resonator designing scheme that can determine the capacitance based on the magnetic coefficients of coupling and the desired principal resonant frequency.

BRIEF SUMMARY OF THE INVENTION

One exemplary embodiment relates to a method for designing a radio frequency (RF) coil assembly. The RF coil assembly has a plurality of antenna elements captured between two annular members and which are encircled by a shield. The RF coil assembly has rotational symmetry. The method includes determining a self inductance associated with any one of the antenna elements by solving analytically or numerically two-dimensional boundary value problems. The method further includes determining at least one mutual inductance associated with an one and an another of the antenna elements by solving analytically or numerically two-dimensional boundary value problems. The method still further includes determining at least one magnetic coefficient of coupling associated with the one and the another of the antenna elements, the at least one magnetic coefficient of coupling expressed as a ratio of the self inductance and the at least one mutual inductance.

Another exemplary embodiment relates to a system for designing a radio frequency (RF) coil assembly. The assembly includes a plurality of antenna elements captured between two annular members and which are encircled by a shield. The RF coil assembly has rotational symmetry. The system includes a computer configured to determine a self inductance associated with any of the antenna elements by solving two-dimensional boundary value problems, and determining a mutual inductance between a first and a second of the antenna elements by solving two-dimensional boundary value problems. The system further includes determining a magnetic coefficient of coupling associated with the first and the second of the antenna elements. The magnetic coefficient of coupling is expressed as a ratio of the self inductance and the mutual inductance.

Another exemplary embodiment relates to a system for designing a radio frequency (RF) coil assembly having a plurality of antenna elements between two annular members and which are encircled by a shield. The RF coil assembly has rotational symmetry. The system includes means for determining a self inductance associated with any one of the antenna elements by solving analytically or numerically two-dimensional boundary value problems, and means for determining at least one mutual inductance associated with an one and an another of the antenna elements by solving analytically or numerically two-dimensional boundary value problems. The system further includes means for determining at least one magnetic coefficient of coupling associated with the one and the another of the antenna elements. The at least one magnetic coefficient of coupling is expressed as a ratio of the self inductance and the at least one mutual inductance.

Still another exemplary embodiment relates to a radio frequency (RF) coil assembly having a plurality of antenna elements captured between two annular members and encircled by a shield. The RF coil assembly is designed by the steps including specifying geometry parameters associated with the RF coil assembly to be designed, and determining a self inductance associated with any one of the antenna elements by solving two-dimensional boundary value problems. The designing steps further include determining mutual inductances between the antenna elements by solving two-dimensional boundary value problems, and determining magnetic coefficients of coupling using the self inductance and the mutual inductances. The designing step still further include determining an individual antenna element frequency corresponding to a principal resonant mode frequency that is equal to a desired Larmor frequency, and determining a capacitance value of a capacitance applied to the ends of the antenna elements.

Yet still another exemplary embodiment relates to a radio frequency (RF) coil assembly, having a central longitudinal axis, for magnetic resonance (MR) imaging or spectroscopy. The assembly includes n antenna elements concentrically positioned within a shield. A longitudinal axis of each of the n antenna elements and of the shield are in parallel with the central longitudinal axis. The assembly further includes a pair of annular members coupled to both ends of the n antenna elements. Each of the annular members includes a bolt circle. The assembly still further includes a capacitance provided at each end of the n antenna elements. The assembly operates at a principal resonant mode frequency that is approximately equal to a desired Larmor frequency. A capacitance value of the capacitance is determined by calculating magnetic coefficients of coupling and an individual antenna element frequency using two-dimensional boundary value problems and a circuit theory of a bird-cage resonator. At least one of the magnetic coefficients of coupling and the individual antenna element frequency functions of physical dimensions of the antenna elements, the shield, and the annular members.

BRIEF DESCRIPTION OF THE DRAWINGS

The preferred embodiment will become more fully understood from the following detailed description, taken in conjunction with the accompanying drawings, wherein like reference numerals denote like elements, in which.

DETAILED DESCRIPTION OF THE EXEMPLARY EMBODIMENTS

Figure 1:
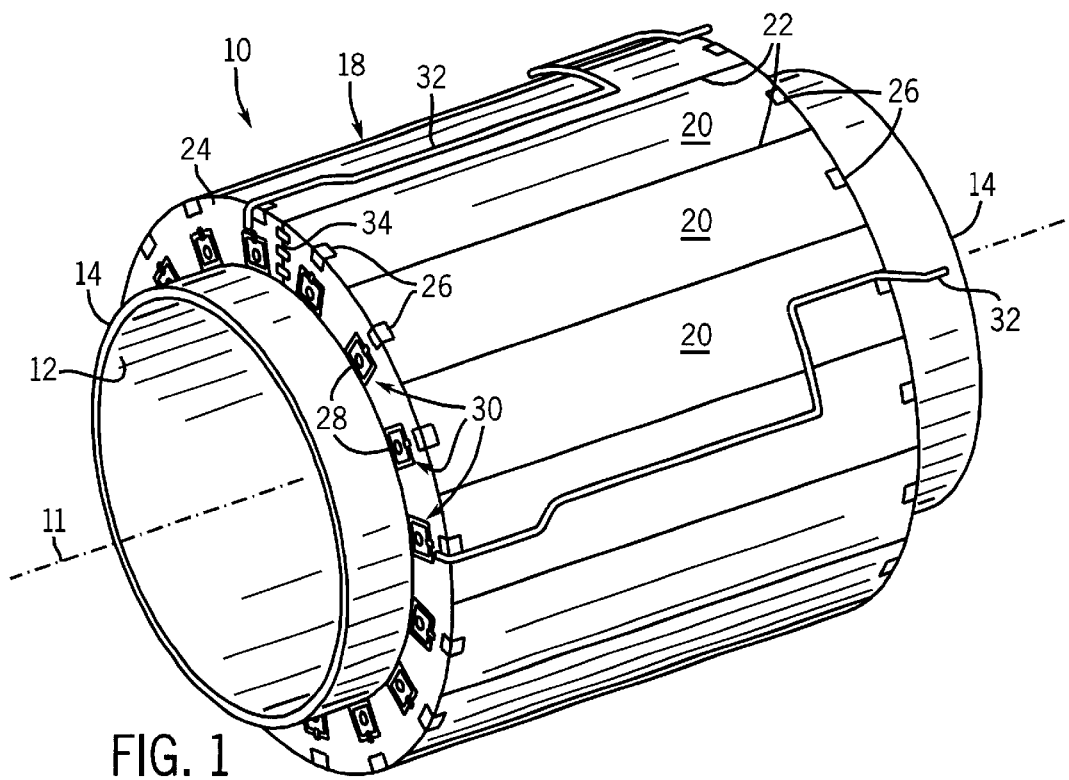
FIG. 1 is a perspective view of an RF coil assembly designed using an embodiment of the present invention.
Figure 2:
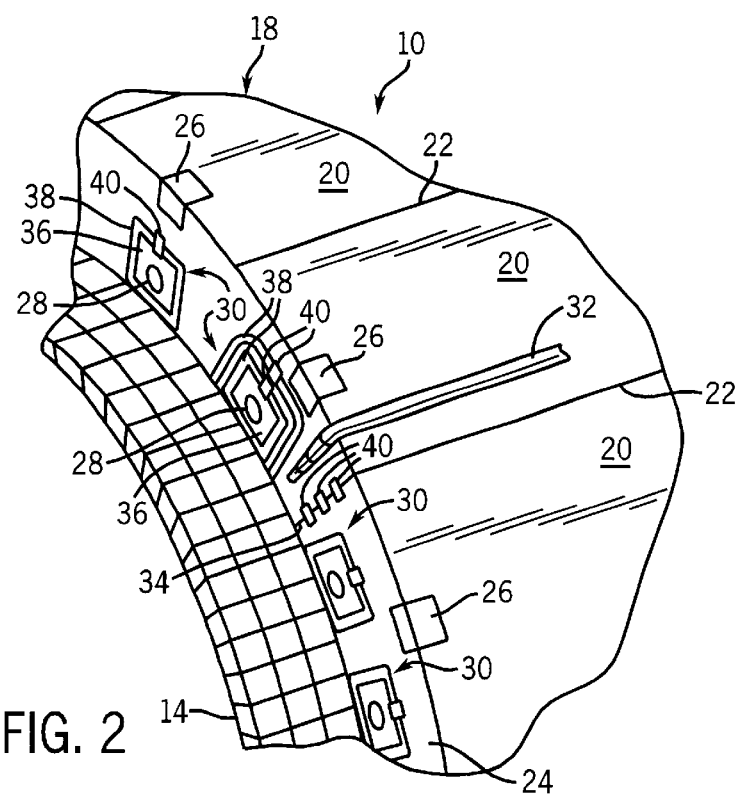
FIG. 2 is a detailed perspective view of a portion of the RF coil assembly of FIG. 1.

Referring to FIGS. 1–6, there are shown a radio frequency (RF) coil assembly 10 included in a magnetic resonance (MR) imaging or spectroscopy system (not shown). Preferably, RF coil assembly 10 is an RF resonator, and more preferably a transverse electromagnetic (TEM) resonator. RF coil assembly 10 can be used at high frequencies, such as, at or above 100 MHz.

RF coil assembly 10 includes inner and outer cylinders 12, 18 concentrically arranged with one another about a central axis 11. The length of inner cylinder 12 extends beyond the ends of outer cylinder 18, producing a lip 14 at the front and back end of assembly 10 (i.e., the left and right ends of assembly 10, as respectively viewed in FIG. 1). An annular cavity located between inner 12 and outer 18 cylinders is capped at both ends with a pair of annular members 24 at the front and back ends of assembly 10. Each annular member 24 includes a bolt circle with n equally-spaced apertures specifically positioned to receive the ends of n antenna elements 28. (See for example FIG. 3, where the bolt circle is defined by apertures 42.) Antenna elements 28 extend between annular members 24.

Outer cylinder 18 comprises an inner tubular member (not shown) with an external shield 20 attached to the outer circumferential surface thereof. Inner cylinder 12 comprises a tubular member made of insulating material, such as, fiberglass or molded polyurethane, using conventional manufacturing techniques. Shield 20 is a conductive layer that provides an electrical shield and acts as an electrical ground for assembly 10. Slots 22 in shield 20 prevent the flow of gradient-induced eddy currents.

In one embodiment, each of annular members 24 is sized to fit snugly in between inner and outer cylinders 12, 18 in a coaxial arrangement. The outer circumferential edge of each of annular members 24 attaches to outer cylinder 18 via n conductive tabs 26, one tab for each conductive panel comprising shield 20. Conductive tabs 26 comprise any commercially available conducting adhesive strip. The inner circumferential edge of annular member 24 may be attached to inner cylinder 12 using a variety of attachment components, such as, adhesives.

Alternatively, annular members 24 may be positioned and held at the ends of outer cylinder 18 by the diameter of the outer circumferential edge of each of annular members 24 being slightly smaller than the diameter of the inner circumferential edge of outer cylinder 18 to form a press fit. In this manner, an electrical connection is established between each of annular members 24 and outer cylinder 18. Moreover, an attachment component, such as, adhesives or welding, may be provided between each of annular members 24 and outer cylinder 18 to ensure that an electrical connection is maintained therebetween.

Figure 3:
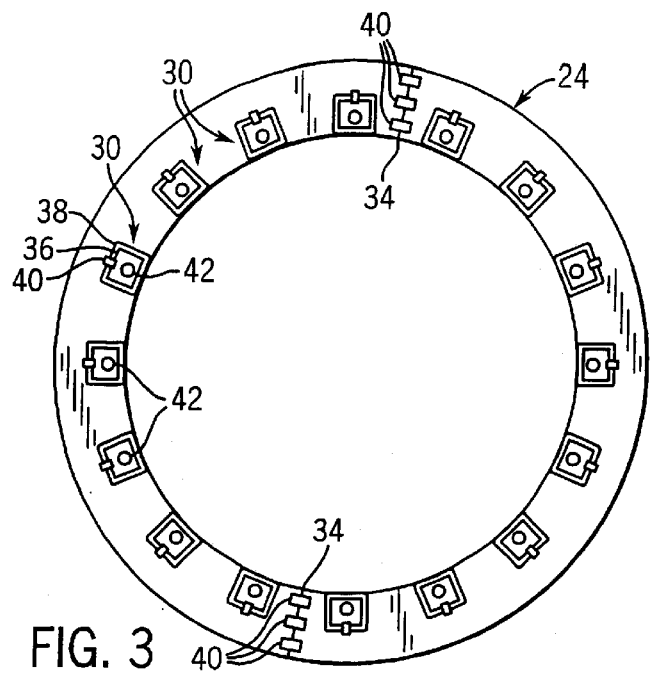
FIG. 3 is an end view of one of the annular members included in the RF coil assembly of FIG. 1.
Figure 4:
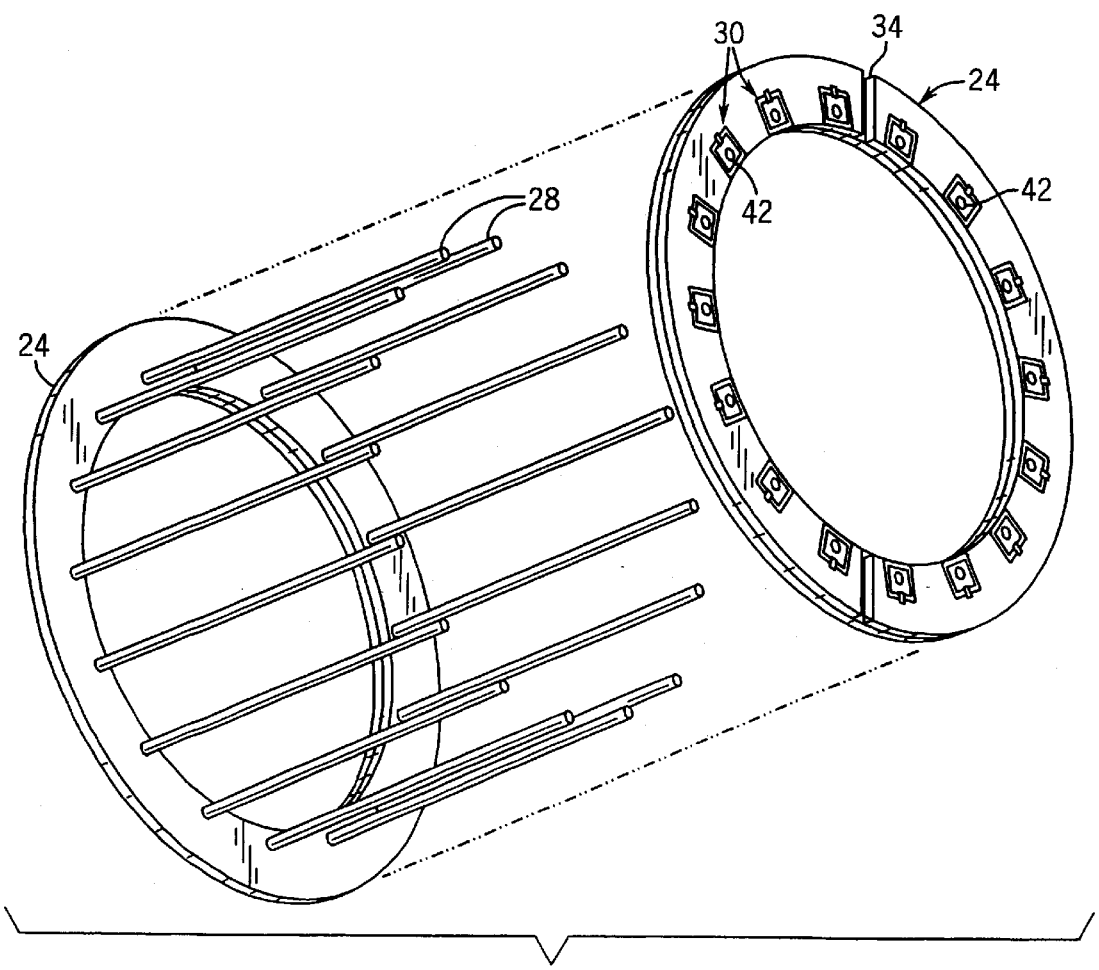
FIG. 4 is a partially exploded perspective view of antenna elements provided between a pair of annular members of the RF coil assembly of FIG. 1.

Each of annular members 24, also referred to as the annulus, comprises a rigid circuit board material, such as, RT duroid of sufficient thickness (e.g., the RT duroid having an insulating substrate thickness of approximately 0.065 inches (1.651 mm)) and is covered by a conductive layer. As shown in FIGS. 3–4, each of annular members 24 includes apertures 42 (in this case, n=16 apertures) that penetrate members 24, and that are equally spaced around the circumference and equal distance from the center thereof. Apertures 42 are configured to receive the ends of antenna elements 28 (in this case, n=16 antenna elements). A corresponding number of sites 30 are provided on an easily accessible outer surface of each of annular members 24, each of sites 30 surrounding one of apertures 42.

The front and back annular members 24 (the left and right annular members, as shown in FIG. 4) are virtually identical to each other, each having n apertures 42 in opposing axial alignment for receiving n antenna elements 28 therebetween, n corresponding sites 30, and two slots 34. However, annular member 24 shown on the left on FIG. 1 differs from annular member 24 on the right, in that two of its sites 30 are located 90° apart for connecting to coaxial transmission lines 32.

When received by the pair of annular members 24, antenna elements 28 are parallel to central axis 11. Antenna elements 28 are elongated and include conductive material. Antenna elements 28 may be hollow tubes, ribbons, or solid tubes comprised of copper material or a variety of other relatively rigid conductive material. The cross-section of any of the antenna elements 28 (the cross-section taken perpendicular to central axis 11) may be a variety of shapes, including but not limited to, a circle, an ellipse, a rectangle, a square, etc. The dimension(s) of such a cross-section may vary widely, as constrained by, among others, MR imaging or spectroscopy system performance.

For example, a rectangular shape in the limiting case (i.e., a ribbon) may have cross-sectional dimensions of 0.9 inches by 0.002 inches (0.0018 square inch) for a resonator used for imaging human heads. A circular rod for imaging human heads may have a cross-sectional diameter of 0.25 inches. Resonators for imaging larger human anatomy (e.g., whole body resonators) may have elements 28 with cross-sectional dimensions on the order of 2 or 3 times larger than discussed above. The ends of antenna elements 28 are held in place (e.g., soldered) to their respective apertures 42 of annular members 24 to make electrical contact with their respective conductive islands 36 (FIG. 5).

Figure 5:
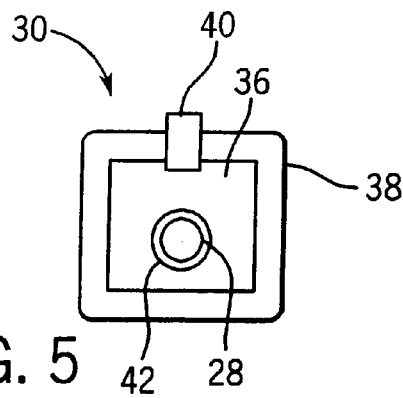
FIG. 5 is a view of a circuitry site portion included in the RF coil assembly of FIG. 1.

As shown in FIG. 5, each of sites 30, also referred to as a circuitry site, includes one of antenna elements 28, a conductive island 36, a non-conducting gap 38, and a lumped element capacitor 40. Non-conducting gap 38 may be formed using conventional etching techniques. Non-conducting gap 38, or correspondingly, conductive island 36, is formed by etching through a portion of the conductive layer of annular member 24 encircling aperture 42, such that each non-conducting gap 38 defines the outer perimeter of its corresponding conductive island 36. Hence, absent an electrical connection (such as, capacitor 40) to bridge non-conducting gap 38, antenna element 28 and conductive island 36 are electrically isolated from inner and outer cylinders 12, 18, shield 20, and the rest of annular members 24.

Conventional etching techniques may also be used to form the pair of diametrically opposing non-conducting slots 34 through the conductive layer of annular members 24. Such etching forms two crescent-shaped regions in the conductive layer (FIGS. 3 and 4). Alternatively, slots 34 may be omitted or more than two slots 34 may be provided to further divide the conductive layers into more than two regions.

Lumped element capacitor 40 comprises one or more capacitors to provide resonant operation of assembly 10. One or more lumped element capacitors 40 are also attached across each of slots 34, having appropriately selected combined capacitance (e.g., above approximately 1000 picofarads/slot) to function as an open circuit at low frequencies and a short circuit at high frequencies (e.g., above approximately 100 MHz). As use of capacitors across slots 34 interrupt direct current and low frequency continuity, but maintains radio frequency continuity. Capacitors 40 may comprise any commercially available lumped element capacitor, such as, surface mounted or porcelain chip capacitors.

Alternatively, capacitors 40 may comprise distributed capacitance. For example, U.S. Pat. No. 4,751,464 to Bridges and U.S. Pat. No. 4,746,866 to Roschmann disclose TEM resonators utilizing distributed capacitance. It is contemplated that assembly 10 may also have a different geometry, size, shape, and/or configuration as discussed in the above patents.

Figure 6:
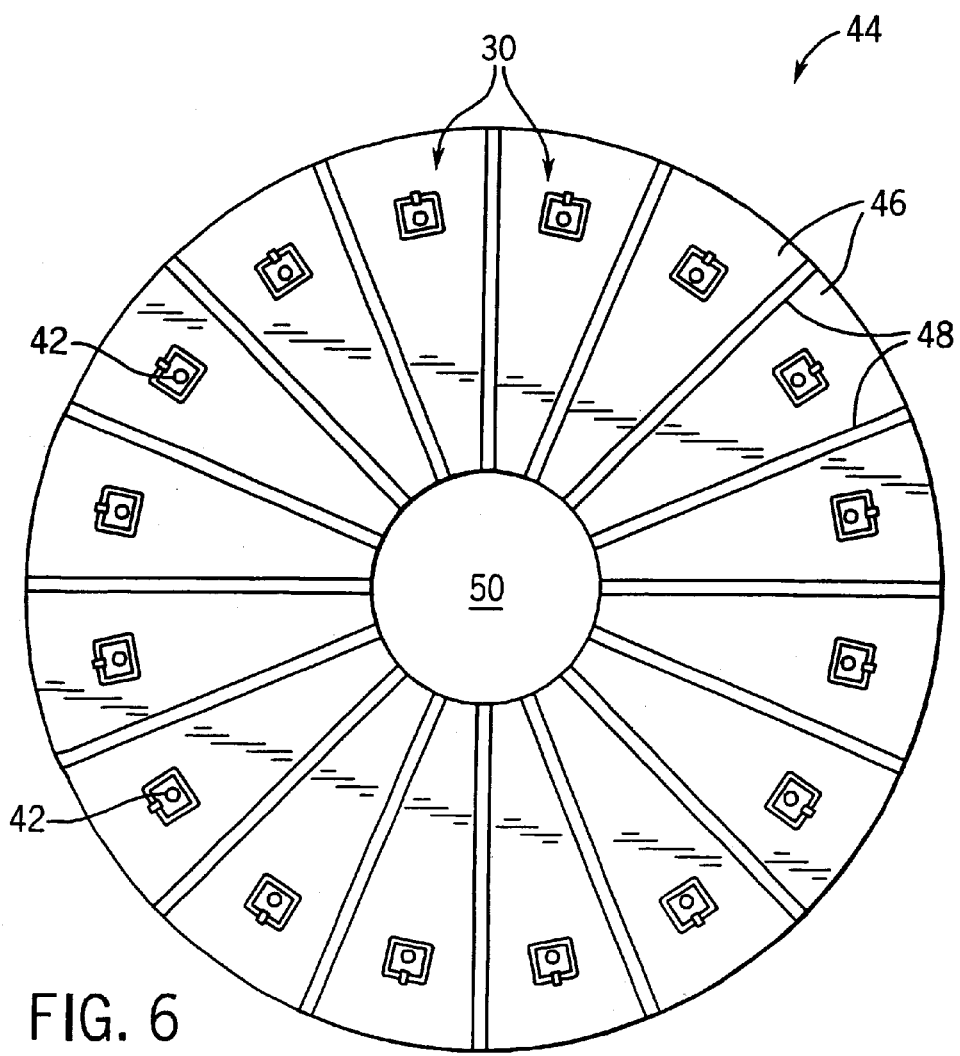
FIG. 6 is a diagram of an end cap included in an another embodiment of the RF coil assembly of FIG. 1.

In another embodiment, assembly 10 may include an end cap 44 in lieu of one of annular member 24 (FIG. 6). Hence, assembly 10 would include one of annular members 24 at a first end of inner and outer cylinders 12, 18 and end cap 44 at a second end of inner and outer cylinders 12, 18. End cap 44 provides a conductive closure of the lumen of inner cylinder 12 at its second end. End cap 44 functions as an RF mirror, providing improved containment of the RF magnetic field produced by energized or excited antenna elements 28. When end cap 44 is used instead of an annular member, lip 14 at the second end would preferably not be used, to permit flush engagement of end cap 44 against the second end of inner and outer cylinders 12, 18.

End cap 44 comprises a disc of contiguous rigid circuit board material, such as RF duroid of sufficient thickness to be rigid, and a conductive layer overlaying or covering the rigid circuit board material, such as copper. End cap 44 includes a bolt circle having apertures 42 and sites 30, as described above for annular members 28. As shown in FIG. 6, end cap 44 includes n sites 30 to correspondingly capture the ends of n antenna elements 28. Similar to sites 30 for annular members 28, each of sites 30 of end cap 44 also includes an end of one of antenna elements 28, conductive island 36, non-conducting gap 38, and lumped element capacitor 40 (or other tuning reactance) (FIG. 5). Non-conducting gaps, such as non-conducting gap 38, suppress eddy currents induced by magnetic gradients applied in tomographic experiments, as is known in the art. Capacitance applied across such non-conducting gaps, such as capacitor 40, provide electrical continuity across such a gap at high frequencies while maintaining electrical discontinuity across such a gap at low frequencies.

End cap 44 may also include n conductive sectors 46 (e.g., 16 conductive sectors are shown in FIG. 6) formed by etching or scribing radial slots 48 through the conductive (surface) layer using conventional etching or scribing techniques. Radial slots 48 intersect with a centrally located common conductive surface 50.

End cap 44 is connected to the second end of assembly 19 using any conventional technique. For example, a non-conductive plug located on the back side of end cap 44 may be inserted and attached by adhesive to the annular cavity between inner and outer cylinders 12, 18. The conductive (surface) layer of end cap 44 couples with a conductive tab 26 of each of the conductive panels of shield 20 to form electrical connections therebetween. The conducting layer of end cap 44 and shield 20 may be conducting laminae.

Assembly 10 including end cap 44 (also referred to as an end cap TEM resonator) behaves similar to assembly 10 including a pair of annular member 24, such as, the approximately two-dimensional nature of the magnetic field produced therein and the interactions between antenna elements 28 (to be described in greater detail hereinafter), such that the design process for determining capacitance values of capacitors 40 and the interaction between antenna elements 28 are substantially the same.

With antenna elements 28 and capacitors 40 in place, each of antenna elements 28 becomes a resonant section, e.g., a half-wave resonant section, provided that capacitors 40, either lumped or distributed, associated with both ends of such an antenna element 28 have (ideally) symmetrical capacitance. Each of antenna elements 28 has an inductance, also referred to as a self inductance, and a resonant frequency, also referred to as an individual resonant frequency, half-wave resonant frequency, or individual antenna element frequency, associated therewith. In one embodiment, each of antenna elements 28 is tuned to the same individual resonant frequency, to form an array of identical coupled resonators disposed concentrically about central axis 11. Such an array of resonators has properties resembling those of the so-called bird-cage resonator. Accordingly, the circuit theory (including the perturbation theory) of the bird-cage resonator is also applicable to assembly 10.

Since there are more than one antenna element 28 provided in assembly 10, any one of antenna elements 28 affects the remaining antenna elements 28, such that the operating frequency of the overall device (i.e., assembly 10) is not the individual resonant frequency of any of antenna elements 28. Instead, similar to bird-cage resonators, mutual coupling between antenna elements 28 gives rise to a family of resonant mode pairs, in which each of such resonant mode pairs has a resonant frequency associated therewith. For a given assembly 10 having n antenna elements 28, the number of resonant modes comprise (n/2)−1 degenerate mode pairs and two non-degenerate modes, for a total of n modes. So for example, for n=16, there will be 7 resonant mode pairs and 2 non-degenerate modes. For n=24, there will be 11 resonant mode pairs and 2 non-degenerate mode pairs. There may be 4, 8, 12, 16, 24, 32, or other quantities of antenna elements 28 in assembly 10.

In particular, of the family of resonant mode pairs, there is only one particular mode pair, commonly referred to as the useful mode pair, the principal mode pair, the principal modes, or (although slightly inaccurate) the principal mode, that will produce a uniform magnetic field in the space inside assembly 10 suitable for MR imaging or spectroscopy. The resonant frequency associated with this useful mode pair is the principal or useful resonant mode frequency. Hence, the operating frequency of assembly 10 should be the principal resonant mode frequency, and the principal resonant mode frequency needs to match the Larmor frequency of the MR signals emitted from the subject of interest positioned within assembly 10.

The geometrical and electrical parameters associated with assembly 10 determine the frequency values for its family of resonant modes. The frequency difference between adjacent modes, i.e., the mode separations, is dependent upon the geometric parameters of assembly 10. The family or spectra of resonant frequencies corresponding to the modes (including the principal resonant frequency) is a function of the individual resonant frequency of an isolated one of antenna elements 28 and upon the mutual interaction between antenna elements 28, expressed as magnetic coefficients of coupling. Under well-known circuit theory, the individual resonant frequency depends upon the capacitance value of capacitors 40. The magnetic coefficients of coupling depend upon the self inductance associated with any of antenna elements 28 and mutual inductances associated between antenna elements 28. Circuit theory of bird-cage resonators, e.g., expressing the relationship between the individual and principal resonant frequencies, are disclosed in "Mutual Inductance in the Bird-Cage Resonator," by James Tropp in *Journal of Magnetic Resonance*, 126, 9–17 (1997), which is incorporated herein by reference.

Thus, upon determination of the capacitance value(s) for capacitors 40 and the values of the magnetic coefficients of coupling (i.e., for assembly 10 having n antenna elements 28, there will be (n−1) magnetic coefficients of coupling), the design process for assembly 10 may be considered to be complete. In particular, to be described in greater detail hereinafter, determination of the magnetic coefficients of coupling subsequently permits the capacitance value(s) of capacitors 40 to be found, either in accordance with well-known principles governing the operation of bird-cage resonators or through a few capacitance value adjustments to just one of antenna elements 28 provided on a working prototype (as opposed to repeatedly adjusting all the capacitance values for all of antenna elements 28).

In one embodiment, an RF coil assembly designing scheme 100 (also referred to as an RF coil assembly designing tool), to be described in greater detail hereinafter, is implemented in a system comprising an input device, a memory, a processor, and an output device. Each of the memory, the input device, and the output device is coupled to the processor. Preferably, the system is a computer system or workstation as is known in the art.

Figure 7A:
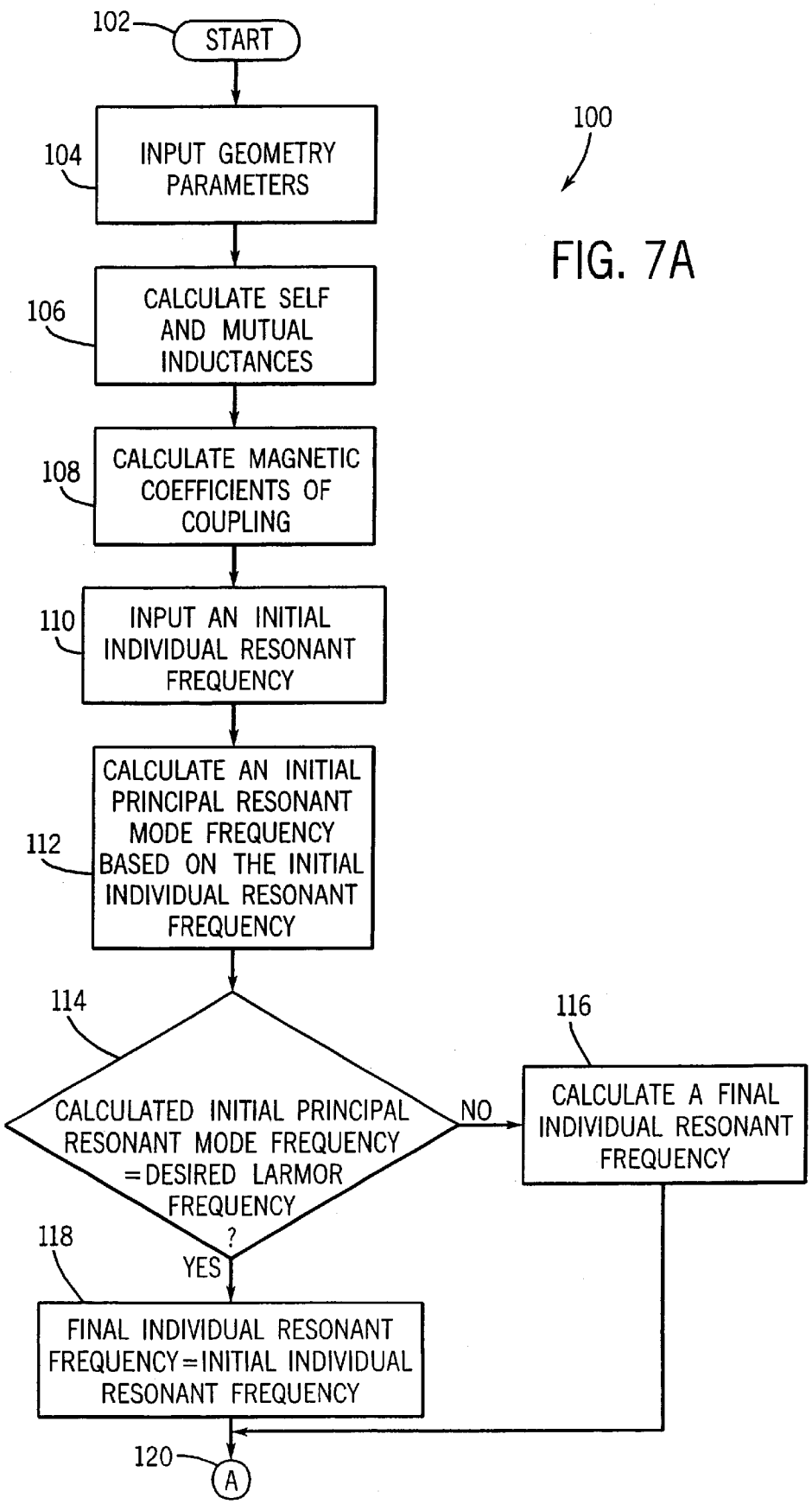
FIGS. 7A–7B are flow diagrams showing one embodiment of an RF coil assembly designing scheme.
Figure 7B:
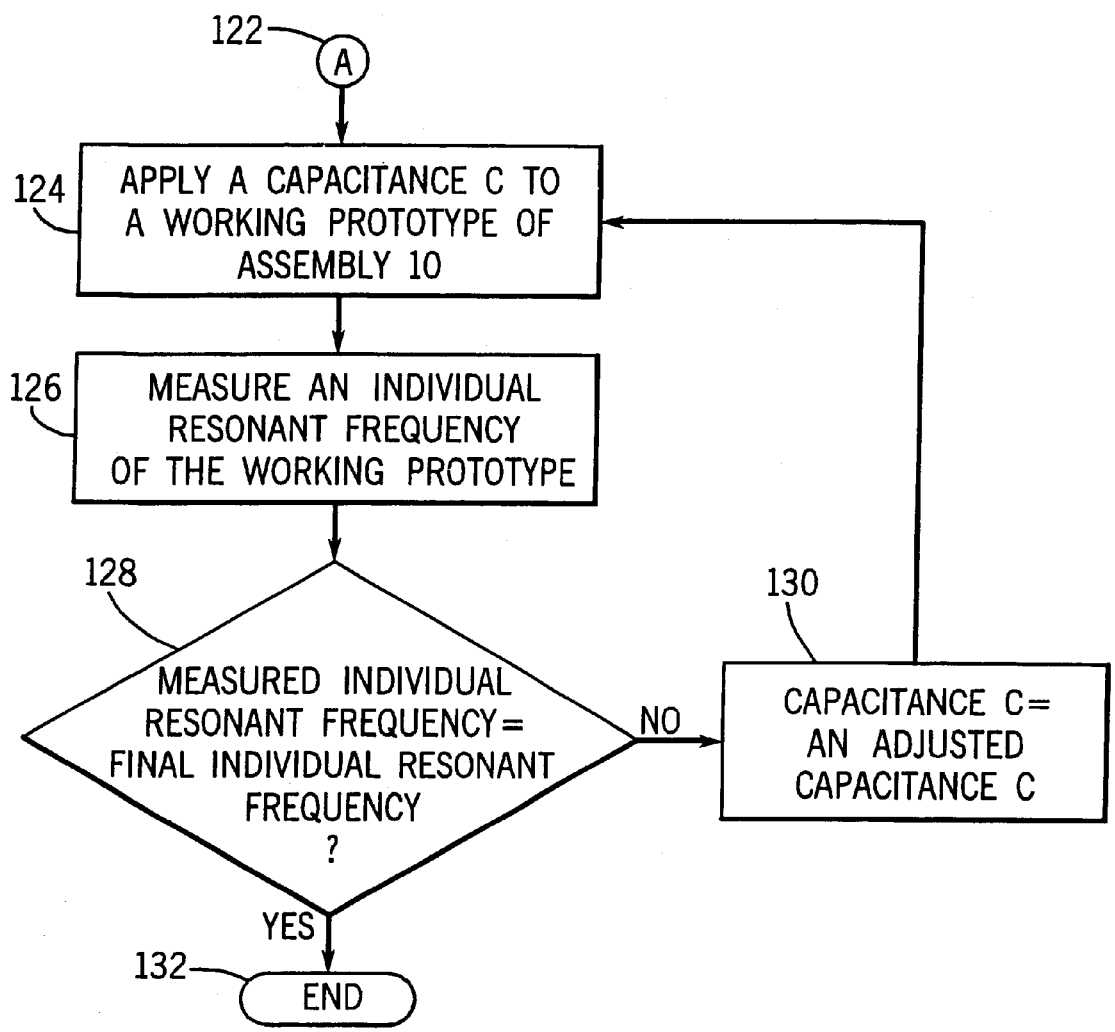

One embodiment of scheme 100 is flow charted in FIGS. 7A–7B. Scheme 100 includes a start step 102, an input geometry parameters step 104, a calculate self and mutual inductances step 106, a calculate magnetic coefficients of coupling step 108, an input an initial individual resonant frequency step 110, a calculate a principal resonant mode frequency step 112, a first inquiry step 114, a calculate a final individual resonant frequency step 116, a final individual resonant frequency step 118, flow chart connectors 120 and 122, an apply a capacitance step 124, a measure an individual resonant frequency step 126, a second inquiry step 128, an adjustment of the capacitance step 130, and an end step 132. Design parameters to construct an RF coil assembly, preferably an TEM resonator such as assembly 10, are determined through the design methodology of scheme 100. Scheme 100 is configured to minimize the length of time and effort involved in present design processes for TEM resonators. Given a desired principal resonant mode frequency (i.e., the Larmor frequency) and specific physical dimension requirements of an RF coil assembly being designed and to be constructed, scheme 100 is configured to provide quantitative values of the remaining design parameters necessary to complete the design of such an RF coil assembly.

In step 102, physical dimensions or geometry parameters of assembly 10 being designed, as decided by a designer, are inputs to scheme 100. System requirements and constraints, such as, mechanical symmetry, robustness, and the size of subjects to be positioned within assembly 10, factor into geometry parameter specifications. In one embodiment, three geometry parameters are inputs to scheme 100: (1) a radius of the cross-section of one of antenna elements 28; (2) a distance from central axis 11 to the center of one of apertures 42 (i.e., a radius of the bolt circle); and (3) a radius of shield 20 (e.g., the distance from central axis 11 to the outer circumference of shield 20). For example, the cross-sectional radius of each of antenna elements 28 may be 0.375 centimeter (cm), the radius of the bolt circle may be 14.6 cm, and the radius of shield 20 may be 17.8 cm. Alternatively, the geometry parameters may be provided in slightly different but equivalent forms, such as, diameter values rather than radii values, as long as it is made clear what the inputted values represent. The number of antenna elements 28 may also be an input in step 102.

It should be understood that the n antenna elements 28 should be of uniform cross-section over their entire lengths. However, antenna elements 28 may be square conductive rods, round conductive rods, flat ribbon conductors, or be of a variety of other cross-sectional shapes. When antenna elements 28 are not of circular cross-section, its "radius" may be analytically calculated and/or approximated as is known in the art.

In step 106, the self inductance associated with any one of antenna elements 28 and the (n−1) mutual inductances between a given one of antenna elements 28 and each of the remaining antenna elements 28 are determined. First, due to the physical symmetry of assembly 10, particularly a circular symmetry in one embodiment, antenna elements 28 of assembly 10 also exhibit interaction symmetry. Accordingly, self and mutual inductances associated with any one of antenna elements 28 are the same inductances associated with respect to all of the remaining antenna elements. For example, if n=16, then in step 106, scheme 100 determines the interaction of an ith antenna element 28 in isolation (i.e., the self inductance), and the interaction of the ith antenna element 28 with each of the 15 remaining antenna elements 28 (i.e., the 15 mutual inductances). Due to the symmetry of assembly 10, these self and mutual inductances for the ith antenna element 28 are also the self and mutual inductances for each of the (i−1)th, (i+1)th, etc. antenna elements 28 of assembly 10.

Moreover, there is symmetry in the mutual inductances for a given antenna element with the antenna elements to its left and right. In other words, for any ith antenna element 28, there are only n/2 unique mutual inductances. And by extension, there are in fact only n/2 unique mutual inductances for all n antenna elements 28. For example, if n=16, then M(1,2)=M(1,16), M(1,3)=M(1,15), M(1,4)=M(1,14), . . . , M(1,8)=M(1,10), and M(1,9) is a singleton value, where M(x,y) is the mutual inductance between the xth and the yth antenna elements in assembly 10 and each yth antenna element is either a left or right neighboring antenna element with respect to the xth antenna element. Hence, there are n/2 mutual inductances between the first antenna element and each of the fifteen remaining antenna elements. Notice that except for the mutual inductance with the antenna element directly opposite a given antenna element (e.g., M(1,9)), the remaining (n/2)−1 mutual inductances are duplicative due to symmetry. Accordingly, in step 106, only one self inductance and n/2 mutual inductance values need be determined to specify the antenna element interactions.

Second, the magnetic field in assembly 10 can be approximated as a two-dimensional field, rather than as a three-dimensional field, that is perpendicular to central axis 11. Since assembly 10 is a magnetic dipole source, each of antenna elements 28 forms a closed circuit loop with the rest of assembly 10. Each circuit loop comprises one of antenna elements 28, the first annular member 24, the first capacitor 40, shield 20, the second capacitor 40, the second annular member 24, and then returns to such an one of antenna elements 28. Of this circuit loop, only antenna element 28 is of high inductance and therefore contributes appreciably to the magnetic flux.

Antenna element 28 carries current only in an axial direction (i.e., parallel to central axis 11), and thus, all of the magnetic flux associated with the magnetic field generated by that current are perpendicular to central axis 11. In other words, the magnetic field contribution from current flow at antenna element 28 is, to a fairly close approximation, only in the transverse plane or direction. On the other hand, contributions of flux from the remaining conductive sections comprising the circuit loop, i.e., the first and second annular members 24 (the magnetic field directed in a radial direction), are extremely small and are thus negligible. Accordingly, for assembly 10 having an axial length of approximately the diameter of the bolt circle of annular member 24, the three-dimensional magnetic field inside assembly 10 can be approximated as a two-dimensional magnetic field that is only in the transverse direction.

By making this approximation, flux lines of two-dimensional magnetic fields are merely contours of constant value of the two-dimensional magnetic vector potential. The magnetic vector potential (i.e., the magnetic field equals the curl of the magnetic vector potential) is a constant at shield 20 because no magnetic flux penetrates shield 20. Within shield 20, the magnetic vector potential is represented as a stream function for the magnetic flux. An analytical expression of the stream function for the magnetic flux can be expressed as:

$$\Xi = \pm \ln \frac{z - \alpha}{z + \alpha}$$

where $\Xi$ is the stream function for the magnetic flux in the complex plane; z is the generic complex variable (x+iy); and $\alpha$ is based on a pair of image currents, as is known in the art of electromagnetic calculation, such as, described in *Static and Dynamic Electricity*, by Smythe, Chapter IV, third edition, McGraw-Hill, N.Y. (1968), from the real axis of the complex plane to fit the boundary value conditions based on the inputted geometry parameters of step 104. The parameter $\alpha$ is a numerical or analytical solution of a set of transcendental equations, as is known in the art.

Figure 8:
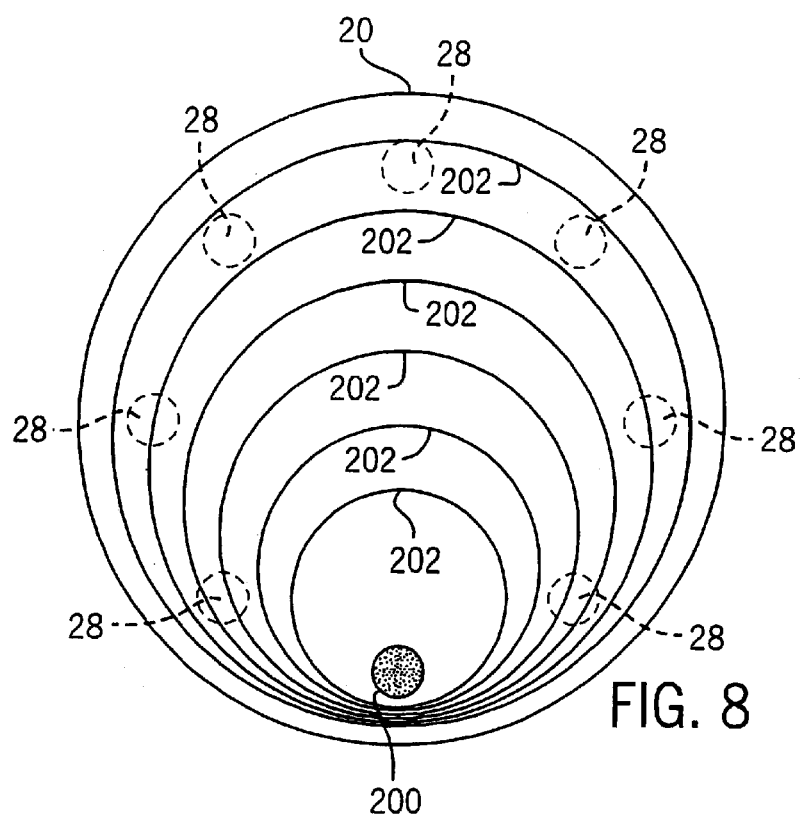
FIG. 8 is a simplified cross-sectional view of one embodiment of the RF coil assembly of FIG. 1, showing flux lines.

Referring to FIG. 8, there is shown a cross-sectional view of assembly 10 having n=8 circular antenna elements 28 (the cross-section taken perpendicular to central axis 11). One of antenna elements 28, i.e., an antenna element 200, is excited with an RF current to produce a two-dimensional magnetic field in the transverse plane, whose flux lines or flux contours 202 are shown as a series of circles in FIG. 8. The remaining antenna elements 28 (shown in dotted lines) are not excited by an RF current (i.e., they are quiescent) and are considered to be omitted or "phantom" elements for purposes of flux lines 202. Flux lines 202 enclose the excited antenna element 200 and are confined inside the periphery of shield 20. Each of flux lines 202 represents an isopotential having a certain numerical value associated therewith, the numerical values being numerical or exact solutions of the stream function of the magnetic flux. In other words, flux lines 202 are drawn at equal intervals of the magnetic vector potential. When two adjacent flux lines are farther apart than another two adjacent flux lines in the same plot or drawing, this represents a smaller magnetic flux per unit area in that location than at the location where the lines are closer together. Numerical values of flux lines 202 or of the magnetic vector potential at a given location within shield 20 are calculated, either analytically or numerically, by solving two-dimensional boundary value problems. Analytical or numerical methods for solving two-dimensional boundary value problems are known in the art.

The self inductance per unit length of antenna element 200 (and due to symmetry, of any of antenna elements 28) is the amount of magnetic flux passing between the surface of antenna element 200 and the inner circumference of shield 20. In one embodiment, the self inductance per unit length of antenna element 200 is the difference between the numerical values of the magnetic vector potential at the surface of antenna element 200 and at the inner circumference of shield 20. Since both surfaces are isopotentials, the exact locations thereon are of little importance. In another embodiment, the self inductance per unit length of antenna element 200 is the number of flux lines 202 passing between antenna element 200 and the inner circumference of shield 20 multiplied by a constant. Assuming that flux lines 202 are drawn at equal intervals based on the numerical values of the magnetic vector potential, counting the number of flux lines multiplied by a constant is equivalent to taking the magnetic vector potential difference between these two surfaces.

The ith mutual inductance per unit length between antenna element 200 and each of the remaining antenna elements 28 (i.e., the ith antenna element, where i=1−(n−1)) can be calculated by exact solution of the two-dimensional boundary value problem or by using an approximation that nevertheless yields a highly accurate solution. In the exact solution method, the numerical values of the magnetic vector potential inside shield 20 are calculated by exact solution of the boundary value conditions where a single antenna element (e.g., antenna element 200) is excited and the others are quiescent. The surfaces of the excited antenna element and of all of the quiescent antenna elements are all isopotential surfaces. Since the magnetic flux always originates from the excited antenna element, the ith mutual inductance per unit length between the excited antenna element and the ith quiescent antenna element is the amount of magnetic flux passing between the surfaces of such two antenna elements. Note that for these mutual inductance calculations, the boundary value conditions with all antenna elements being present is required to be solved.

In the approximation method, the numerical values of the magnetic vector potential inside shield 20 are calculated by solving the boundary value problem assuming only a single antenna element is present and excited inside shield 20. In the case of such a single antenna element having a circular cross-sectional shape, an exact solution of its boundary value problem is known in the art. Next, scheme 100 imagines that all the antenna elements are present or returned inside shield 20 and that there is an imaginary perimeter or circle with its center at central axis 11 and which surrounds all the antenna elements. The surface of each of the antenna elements closest to shield 20 is tangent to the inner circumference of this imaginary circle. (The radius of the imaginary circle is, accordingly, the radius of the bolt circle plus the radius of any of antenna elements 28.) Then the ith mutual inductance per unit length between the excited antenna element and each of the quiescent or "omitted" antenna elements (i.e., the ith antenna element, where i=1–(n–1)) is the difference in magnetic vector potential (as already solved assuming only a single antenna element was present and excited) at the tangency point of the ith antenna element with the imaginary circle and at the inner circumference of shield 20. Alternatively, equivalent ith mutual inductances (to within a multiplicative constant) can be obtained by counting the number of flux lines between such two surfaces, assuming such flux lines or contours are drawn at equal intervals of the magnetic vector potential.

The accuracy of mutual inductances calculated using this approximation method increases as the radius of antenna elements 28 decreases relative to the radius of shield 20. In general, the approximation method takes advantage of cases where the quiescent antenna elements negligibly perturb the magnetic field produced by the excited antenna element.

Figure 9:
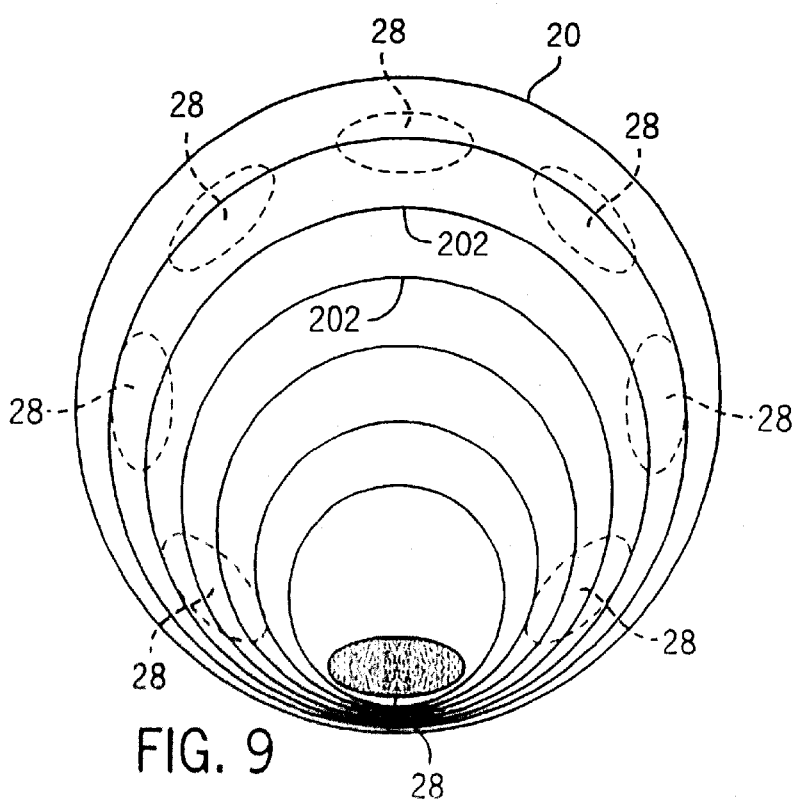
FIG. 9 is a simplified cross-sectional view of another embodiment of the RF coil assembly of FIG. 1, showing flux lines.

Referring to FIG. 9, there is shown a cross-sectional view of assembly 10 having n=8 elliptically shaped antenna elements 28 and flux lines 202. Flux lines 202 reflect only one of elements 28 (the blackened element) being excited while the remaining elements 28 (shown in dotted lines) are omitted (and thus, also quiescent). Assembly 10 having non-circularly shaped antenna elements 28, such as shown in FIG. 9, can similarly determine self and mutual inductances as discussed above, although exact solutions (in closed form) to boundary value problems may not exist depending on the cross-sectional shape of antenna elements 28 and/or numerical solutions may be more difficult to formulate. Examples of methods to obtain numerical solutions include, but are not limited to, the method of moments, the method of finite elements, or a variety of other solution methodologies as is known in the art.

Once a self inductance per unit length and (n–1) mutual inductances per unit length are determined in step 106, (n–1) magnetic coefficients of coupling are determined in step 108. In one embodiment, the ith magnetic coefficient of coupling is given by:

$$i\text{th magnetic coefficient of coupling} = \frac{i\text{th mutual inductance per unit length}}{\text{self inductance per unit length}}.$$

For each i=1 to (n–1), both the ith mutual inductance and the self inductance can be numerical values calculated from taking the magnetic vector potential differences at the appropriate surfaces as discussed above. Alternatively, both the ith mutual inductance and the self inductance can be the number of flux lines counted between the appropriate surfaces as discussed above. However, for a given i, one of the values of the ith mutual inductance and the self inductance may not be a magnetic vector potential difference and the other the counted number of flux lines, because the unknown multiplicative constant associated with the counted number of flux lines will remain (i.e., it cannot be cancelled because it will not appear in both the numerator and denominator in the above ratio).

The (n–1) magnetic coefficients of coupling values determined in step 108 represent the interactions between antenna elements 28 of assembly 10 (per specific geometry parameters as provided in step 104). Using these interaction values, the remaining design parameter, i.e., the capacitance value(s) of capacitors 40, can be obtained using circuit equations for the bird-cage resonator (which is known in the art) and a minimum of iterative effort to a working prototype, thereby permitting assembly 10 to be fully designed and constructed in a short time period.

In another embodiment, each of the magnetic coefficients of coupling determined in step 108 may be a function of a mutual inductance, a mutual reactance, and/or a mutual resistance (collectively, a mutual impedance). Such mutual impedance further expresses the coupling or interaction between excited antenna elements 28.

Once the magnetic coefficients of coupling have been determined, in step 110, an initial individual resonant frequency associated with any one of antenna elements 28 is provided by the designer to or is provided as a default value by scheme 100. In either case, the exact value of the initial individual resonant frequency is not paramount. (In other words, this initial value can be a guess.) The initial individual resonant frequency (from step 110) along with the calculated (n–1) coefficients of coupling values (from step 108) are used to calculate the corresponding principal resonant mode frequency in step 112. Although not shown, step 112 may provide the resonant mode frequencies for all of the resonant modes of assembly 10. For example, the initial individual resonant frequency may be 100 MHz and the corresponding initial principal mode frequency calculated in step 112 may be 96 MHz.

Since assembly 10 should be designed such that it will be tuned to operate at a principal mode frequency that is equal to the Larmor frequency, an inquiry is made as to whether the calculated principal mode frequency (based on the initial individual resonant frequency) is equal to the desired Larmor frequency in step 114. For example, in a 1.5 Tesla magnetic field, the protons of the anatomy under study will precess at approximately 64 MHz (i.e., the Larmor frequency at 1.5 Tesla is 64 MHz). For a 3 Tesla magnetic field, the Larmor frequency will be approximately 128 MHz.

If the calculated principal mode frequency is equal to the Larmor frequency, then a final or actual individual resonant frequency is the initial resonant frequency provided in step 110 (step 118). This condition indicates that the "guessed" value of the initial individual resonant frequency was correct and no iteration is necessary to correct it. On the other hand, if the calculated principal mode frequency is not equal to the Larmor frequency, then a final or correct individual resonant frequency is calculated in step 116. The calculation of step 116 is as follows: final or correct individual resonant frequency=(initial individual resonant frequency*Larmor frequency)/calculated principal mode frequency. Such is the case because the mathematical expression for mode frequency depends linearly upon the half-wave frequency of the individual antenna element, as is known in the art. Thus, once the principal mode frequency is calculated in step 112, even if it is not identical to the desired Larmor frequency, a scaling adjustment is sufficient to arrive at the actual individual resonant frequency that will achieve the desired overall resonant operation of assembly 10.

Continuing the example, since the initial principal mode frequency is calculated at 96 MHz but the desired Larmor frequency is 128 MHz (i.e., initial principal mode frequency is not equal to the Larmor frequency), the final individual resonant frequency will have to be calculated (as in step 116)

to be 133.3 MHz. Thus, in order to have an assembly 10 with the geometry parameters specified in step 104 and for it to be tuned to the Larmor frequency (in this case, 128 MHz), the individual resonant frequency of each of antenna elements 28 is required to be 133.3 MHz.

It is contemplated that steps 114–118 may be omitted from scheme 100 and may instead be performed by a person. Although steps 114–118 are mathematically simple, inclusion into scheme 100 provides further ease and time reduction to the design of assembly 10.

Portions of steps 124–132 are preferably performed using a working prototype of assembly 10. Upon determination of the final individual resonant frequency in step 116 or 118, the designer applies capacitors 40, each having an initial capacitance value C, across islands 38 at both ends of a single antenna element 28 of the working prototype (step 124). Preferably, capacitor 40 at each end of a single antenna element 28 has the same initial capacitance value C. For example, initial capacitance value C may be approximately 18 picofarads. Alternatively, the initial capacitance value C of capacitors 40 may be a variety of other values.

With capacitors 40 in place, the individual resonant frequency associated with that single antenna element 28 is measured in step 126. Performing such a measurement is known in the art. If the measured individual resonant frequency in step 126 is equal to the final individual resonant frequency determined in step 116 or 118, then capacitance value C is the final or actual capacitance value of each of capacitors 40 for assembly 10 (to operate overall at the Larmor frequency). Thus, all necessary design parameters have been found and the design process is complete (step 132). Otherwise, if the measured individual resonant frequency is not equal to the final individual resonant frequency of step 116 or 118, then initial capacitance value C is adjusted in step 130. The adjustment step of step 116 is as follows: an adjusted capacitance value=(square of the measured individual resonant frequency)*(capacitance value C)/(square of the final individual resonant frequency). The new or adjusted capacitance value is then applied to the working prototype (step 124) as the next iteration in the determination of the correct capacitance value C. This loop or iteration may be performed a plurality of times until the condition of step 128 is satisfied.

At frequencies of approximately 100 MHz, assembly 10 operates outside the quasi-static regime and wavelength effects become important. For this reason, the scaling adjustment of capacitance C in step 130 may not immediately yield the correct capacitance value. Nevertheless, the scaling adjustment calculated in step 130 provides fairly accurate capacitance values such that no more than a couple of iterations are necessary to determine the correct capacitance value C.

In this manner, scheme 100 provides a design methodology that allows assembly 10 to be fully designed within a short time period and with relatively little trial and error. The design process no longer requires capacitors to be applied to all of antenna elements 28 in the working prototype and to determine the correct capacitance value through numerous iterations that may have little relationship to each other. In contrast, with scheme 100, only a pair of capacitors are applied to both ends of a single antenna element 28 in each iteration, and each iteration is based on more than an educated guess.

It should be understood that capacitors 40 may be distributed capacitance. Preferably, however, capacitors 40 are lumped element capacitance for ease in the iterative process to determine the correct capacitance value C.

The software executed by a system including a processor implementing at least a part of scheme 100 is listed in the Appendix. The software listed in the Appendix calculates, among others, the (n−1) magnetic coefficients of coupling values for assembly 10 having n antenna elements 28 of circular cross-sectional shape.

In one embodiment, once the resonant mode frequencies corresponding to the resonant mode pairs are determined, another design issue, i.e., evaluating the strength of the magnetic field per unit of applied RF current generated in the useful mode, can be addressed. Since the magnetic vector potential inside shield 20 has been calculated in the case of a single excitation antenna element, the two-dimensional magnetic field or flux function corresponding thereto can be mathematically rotated (as a vector field) to also represent the magnetic flux resulting from a differently positioned antenna element.

Since the currents in all of antenna elements 28 of assembly 10 for the useful mode can be calculated from circuitry theory of bird-cage resonators, the resulting total magnetic field can be modeled by application of the principle of superposition. This application involves vector rotation and addition of the magnetic field generated from each of the antenna elements and the current associated with each of the antenna elements being weighted by its known value in the useful mode. In this manner, the total magnetic field strength per unit applied current, either calculated directly using the magnetic field or indirectly using the magnetic vector potential, can be calculated. Then, different geometries of assembly 10 may be compared. In another embodiment, this comparison can be further refined to approximate the transmit/receive efficiency of various geometries of assembly 10, by estimating the losses due to a conductive or lossy dielectric load inside assembly 10.

While the embodiments and application of the invention illustrated in the figures and described above are presently preferred, it should be understood that these embodiments are offered by way of example only. For example, it is contemplated that the cross-sectional shape of shield 20 may be a shape other than circular, such as, elliptical, rectangular, etc. Accordingly, the present invention is not limited to a particular embodiment, but extends to various modifications that nevertheless fall within the scope of the appended claims.

What is claimed is:

1. A method for designing a radio frequency (RF) coil assembly having a plurality of antenna elements captured between two annular members and encircled by a shield, the RF coil assembly having rotational symmetry, the method comprising the steps of:

(a) determining a self inductance associated with any one of the antenna elements by solving analytically or numerically two-dimensional boundary value problems;

(b) determining at least one mutual inductance associated with any pair of the antenna elements by solving analytically or numerically two-dimensional boundary value problems; and (c) determining at least one magnetic coefficient of coupling associated with the pair of the antenna elements, the at least one magnetic coefficient of coupling expressed as a ratio of the self inductance and the at least one mutual inductance.

2. The method of claim 1, further comprising:

providing geometry parameters before any of determining steps (a)–(c).

3. The method of claim 2, wherein the geometry parameters include at least one of a radius, a diameter, or dimensions of the cross-section of the antenna elements; a radius or a diameter of a bolt circle included in each of the annular members; a radius or a diameter of the shield; and the number of antenna elements.

4. The method of claim 1, further comprising:
providing an initial individual antenna element frequency; and
determining at least one resonant mode frequency based on the initial individual antenna element frequency and the at least one magnetic coefficient of coupling.

5. The method of claim 4, wherein determining at least one resonant mode frequency includes utilizing a circuit theory for a bird-cage resonator.

6. The method of claim 4, further comprising:
determining an initial principal resonant mode frequency based on the initial individual antenna element frequency and the at least one magnetic coefficient of coupling; and
determining a final individual antenna element frequency based on the initial principal resonant mode frequency.

7. The method of claim 6, wherein the final individual antenna element frequency is the initial individual antenna element frequency when the initial principal resonant mode frequency is equal to a desired Larmor frequency.

8. The method of claim 6, wherein the final individual antenna element frequency is a scaled adjustment of the initial individual antenna element frequency when the initial principal resonant mode frequency is not equal to a desired Larmor frequency.

9. The method of claim 6, further comprising:
determining a capacitance value of a capacitance applied to the ends of the antenna elements based on the final individual antenna element frequency.

10. The method of claim 9, wherein the capacitance is selected from a group including a lumped element capacitance and a distributed capacitance.

11. The method of claim 1, wherein determining steps (a)–(c) includes approximating a three-dimensional magnetic field generated within the RF coil assembly to be a two-dimensional magnetic field in a transverse direction.

12. The method of claim 1, wherein the determining step (a) includes determining numerical values of a magnetic vector potential by solving the two-dimensional boundary value problems for a transverse cross-sectional area inside the RF coil assembly.

13. The method of claim 12, wherein the determining step (a) includes determining the amount of magnetic flux intercepted between a surface of any one of the antenna elements and an inner circumferential surface of the shield.

14. The method of claim 12, wherein the determining step (a) includes determining a difference between the numerical values of the magnetic vector potential at a surface of any one of the antenna elements and at an inner circumferential surface of the shield.

15. The method of claim 12, wherein the determining step (a) includes presenting flux lines drawn at intervals of the magnetic vector potential inside the transverse cross-section of the RF coil assembly and counting a number of the flux lines between a surface of any one of the antenna elements and at an inner circumferential surface of the shield.

16. The method of claim 1, wherein the self inductance is a self inductance per unit length of the antenna elements and the same self inductance is associated with each of the antenna elements due to the rotational symmetry of the RF coil assembly.

17. The method of claim 1, wherein the determining step (b) includes determining numerical values of a magnetic vector potential for a transverse cross-sectional area inside the RF coil assembly by solving the two-dimensional boundary value problems with the one of the antenna elements being excited by a current and the remaining antenna elements being quiescent.

18. The method of claim 17, wherein the remaining antenna elements being quiescent are also assumed to be absent from the RF coil assembly for determining numerical values of the magnetic vector potential.

19. The method of claim 17, wherein the mutual inductance associated with the one and the another of the antenna elements is the amount of magnetic flux passing between the another of the antenna elements and the shield, the another of the antenna elements being quiescent.

20. The method of claim 17, wherein the mutual inductance associated with the one and the another of the antenna elements is a difference between the numerical values of the magnetic vector potential at a surface of the another of the antenna elements and at an inner circumferential surface of the shield, the another of the antenna elements being quiescent.

21. The method of claim 17, wherein the two-dimensional boundary value problems are analytically solved.

22. The method of claim 1, wherein the determining step (b) includes determining numerical values of a magnetic vector potential for a transverse cross-sectional area inside the RF coil assembly by solving the two-dimensional boundary value problems with only the one of the antenna elements assumed to be present and excited within the RF coil assembly.

23. The method of claim 22, wherein the determining step (b) further includes assuming the presence of all of the antenna elements within the RF coil assembly after the two-dimensional boundary value problems have been solved and providing an imaginary perimeter around all of the antenna elements.

24. The method of claim 23, wherein the imaginary perimeter has a radius equal to a radius of the annular members to a bolt circle included thereon plus a radius of any of the antenna elements.

25. The method of claim 23, wherein the shape of the imaginary perimeter is the same as the transverse cross-sectional shape of the shield.

26. The method of claim 23, wherein providing an imaginary perimeter includes the imaginary perimeter being tangent to a side of each of the antenna elements that is closest to an inner circumference of the shield.

27. The method of claim 26, wherein the mutual inductance associated with the one and the another of the antenna elements is a difference in the magnetic vector potential at the tangency point of the another of the antenna elements to the imaginary perimeter and at a closest inner circumference point of the shield.

28. The method of claim 1, wherein the RF coil assembly includes an n number of the antenna elements and further comprising n/2 mutual inductances associated with the one of the antenna elements and each of the n/2 antenna elements to the left or right of the one of the antenna elements by solving analytically or numerically the two-dimensional boundary value problems.

29. The method of claim 28, further comprising determining (n−1) magnetic coefficients of coupling associated with the one of the antenna elements and each of the remaining (n−1) antenna elements, wherein an ith magnetic coefficient of coupling is equal to the ith mutual inductance divided by the self inductance.

30. The method of claim 1, wherein the determining steps (a)–(b) includes solving the two-dimensional boundary value problems to generate numerical values of a magnetic vector potential within a transverse cross-sectional area of the RF coil assembly when at least one of the antenna elements is present and excited within the RF coil assembly.

31. The method of claim 30, wherein an analytical expression of a magnetic flux associated with the magnetic vector potential within the transverse cross-sectional area of the RF coil assembly is a stream function.

32. The method of claim 31, wherein the stream function includes a parameter $\alpha$ associated with geometry parameters of the RF coil assembly, the parameter $\alpha$ generated by analytical or numerical solution of a system of transcendental equations.

33. The method of claim 1, wherein the mutual inductance is a mutual inductance per unit length of the antenna elements.

34. The method of claim 1, wherein the RF coil assembly is a transverse electromagnetic (TEM) resonator.

35. The method of claim 1, wherein the antenna elements include conductive material and each of the antenna elements has a cross-sectional shape selected from a group including circular, elliptical, square, rectangle, and a variety of other shapes.

36. The method of claim 1, wherein each of the antenna elements has a uniform cross-section along its entire length.

37. The method of claim 1, wherein a numerical solution of the two-dimensional boundary value problems include using a method selected from a group including a method of moments, a method of finite elements, and a variety of other methods.

38. A system for designing a radio frequency (RF) coil assembly having a plurality of antenna elements captured between two annular members and encircled by a shield, the RF coil assembly having rotational symmetry, the system comprising a computer configured to determine a self inductance associated with any of the antenna elements by solving two-dimensional boundary value problems, determining a mutual inductance between a first and a second of the antenna elements by solving two-dimensional boundary value problems, and determining a magnetic coefficient of coupling associated with the first and the second of the antenna elements, the magnetic coefficient of coupling expressed as a ratio of the self inductance and the mutual inductance.

39. The system of claim 38, wherein the computer includes an input device configured to receive geometry parameters to determine the self inductance, the mutual inductance, and the magnetic coefficient of coupling.

40. The system of claim 39, wherein the geometry parameters include at least one of a radius, a diameter, or dimensions of a cross-section of the antenna elements; a radius or a diameter of a bolt circle included in each of the annular members; a radius or a diameter of the shield; and the number of antenna elements.

41. The system of claim 38, wherein the computer is further configured to determine at least one resonant mode frequency based on an initial individual antenna element frequency and the magnetic coefficient of coupling.

42. The system of claim 41, wherein the initial individual antenna element frequency is provided as at least one of an input to the computer and a default value predetermined by the computer.

43. The system of claim 41, wherein the computer is configured to determine the at least one resonant mode frequency using a circuit theory for a bird-cage resonator.

44. The system of claim 41, wherein the computer is configured to determine an initial principal resonant mode frequency based on the initial individual antenna element frequency and the magnetic coefficient of coupling, and determine a final individual antenna element frequency based on the initial principal resonant mode frequency.

45. The system of claim 44, wherein the computer is configured to determine the final individual antenna element frequency equal to the initial individual antenna element frequency when the initial principal resonant mode frequency is equal to a desired Larmor frequency.

46. The system of claim 44, wherein the computer is configured to determine the final individual antenna element frequency to be a scaled adjustment of the initial individual antenna element frequency when the initial principal resonant mode frequency is not equal to a desired Larmor frequency.

47. The system of claim 44, wherein the computer is configured to determine a capacitance value of a capacitance applied to the ends of the antenna elements based on the final individual antenna element frequency.

48. The system of claim 47, wherein the capacitance is selected from a group including a lumped element capacitance and a distributed capacitance.

49. The system of claim 38, wherein the self inductance, the mutual inductance, and the magnetic coefficient of coupling are determined by approximating a three-dimensional magnetic field generated within the RF coil assembly to be a two-dimensional magnetic field in a transverse direction.

50. The system of claim 38, wherein the self inductance is determined by solving analytically or numerically the two-dimensional boundary value problems to generate numerical values of a magnetic vector potential for a transverse cross-sectional area inside the RF coil assembly.

51. The system of claim 50, wherein the self inductance is the amount of magnetic flux intercepted between a surface of any of the antenna elements and an inner circumferential surface of the shield.

52. The system of claim 50, wherein the self inductance is a difference between the numerical values of the magnetic vector potential at a surface of any one of the antenna elements and at an inner circumferential surface of the shield.

53. The system of claim 50, wherein the self inductance is the number of flux lines between a surface of any one of the antenna elements and at an inner circumferential surface of the shield, the computer configured to present flux lines drawn at select intervals of the magnetic vector potential inside the transverse cross-section of the RF coil assembly via a display included in the computer.

54. The system of claim 38, wherein the self inductance is a self inductance per unit length of the antenna elements and the self inductance is the same for each of the antenna elements due to the rotational symmetry of the RF coil assembly.

55. The system of claim 38, wherein the mutual inductance is determined by solving analytically or numerically the two-dimensional boundary value problems with the first of the antenna elements excited by a current and the remaining antenna elements quiescent, to generate numerical values of a magnetic vector potential for a transverse cross-sectional area inside the RF coil assembly.

56. The system of claim 55, wherein the mutual inductance associated with the first and the second of the antenna elements is the amount of magnetic flux passing between the second of the antenna elements and the shield.

57. The system of claim 55, wherein the mutual inductance associated with the first and the second of the antenna elements is a difference between the numerical values of the magnetic vector potential at a surface of the second of the antenna elements and at an inner circumferential surface of the shield.

58. The system of claim 55, wherein the two-dimensional boundary value problems are analytically solved.

59. The system of claim 38, wherein the mutual inductance is determined by solving analytically or numerically the two-dimensional boundary value problems assuming only the first of the antenna elements is present and excited within the RF coil assembly, to generate numerical values of a magnetic vector potential for a transverse cross-sectional area inside the RF coil assembly.

60. The system of claim 59, wherein the mutual inductance is further determined by assuming all of the antenna elements are present within the RF coil assembly after the two-dimensional boundary value problems have been solved and the computer configured to provide an imaginary perimeter around all of the antenna elements.

61. The system of claim 60, wherein the imaginary perimeter has a radius equal to a bolt circle included in each of the annular members plus a radius of any of the antenna elements.

62. The system of claim 60, wherein the shape of the imaginary perimeter is the same as the transverse cross-sectional shape of the shield.

63. The system of claim 60, wherein the imaginary perimeter is tangent to a side of each of the antenna elements that is closest to an inner circumference of the shield.

64. The system of claim 63, wherein the mutual inductance is a difference in the magnetic vector potential at the tangency point of the second of the antenna elements to the imaginary perimeter and at a closest inner circumference point of the shield.

65. The system of claim 38, wherein the RF coil assembly includes an n number of the antenna elements and the computer is configured to determine (n/2) mutual inductances associated with the first of the antenna elements and each of the remaining (n/2) antenna elements that are to the left or right of the first of the antenna elements by solving analytically or numerically the two-dimensional boundary value problems.

66. The system of claim 65, wherein the computer is configured to determine (n−1) magnetic coefficients of coupling associated with the first of the antenna elements and each of the remaining (n−1) antenna elements, wherein an ith magnetic coefficient of coupling is equal to the ith mutual inductance divided by the self inductance.

67. The system of claim 38, wherein determination of the self inductance and the mutual inductance includes solving the two-dimensional boundary value problems to generate numerical values of a magnetic vector potential within a transverse cross-sectional area of the RF coil assembly when at least one of the antenna elements is present and excited within the RF coil assembly.

68. The system of claim 67, wherein an analytical expression of a magnetic flux associated with the magnetic vector potential within the transverse cross-sectional area of the RF coil assembly is a stream function.

69. The system of claim 68, wherein the stream function includes a parameter a associated with geometry parameters of the RF coil assembly.

70. The system of claim 69, wherein the parameter α is generated by analytical or numerical solution of a system of transcendental equations.

71. The system of claim 38, wherein the mutual inductance is a mutual inductance per unit length of the antenna elements.

72. The system of claim 38, wherein the RF coil assembly is a transverse electromagnetic (TEM) resonator.

73. The system of claim 38, wherein the antenna elements include conductive material and each of the antenna elements has a cross-sectional shape selected from a group including circular, elliptical, square, rectangular, and a variety of other shapes.

74. The system of claim 38, wherein each of the antenna elements has a uniform cross-section along its entire length.

75. The system of claim 38, wherein a numerical solution of the two-dimensional boundary value problems include using a methodology selected from a group including a method of moments, a method of finite elements, and a variety of other methodologies.

76. A system for designing a radio frequency (RF) coil assembly having a plurality of antenna elements between two annular members and encircled by a shield, the RF coil assembly having rotational symmetry, the system comprising:
means for determining a self inductance associated with any one of the antenna elements by solving analytically or numerically two-dimensional boundary value problems;
means for determining at least one mutual inductance associated with any pair of the antenna elements by solving analytically or numerically two-dimensional boundary value problems; and
means for determining at least one magnetic coefficient of coupling associated with the pair of the antenna elements, the at least one magnetic coefficient of coupling expressed as a ratio of the self inductance and the at least one mutual inductance.

77. The system of claim 76, further comprising means for providing geometry parameters.

78. The system of claim 77, wherein the geometry parameters include at least one of a radius, a diameter, or dimensions of the cross-section of the antenna elements; a radius or a diameter of a bolt circle included in each of the annular members; a radius or a diameter of the shield; and the number of antenna elements.

79. The system of claim 76, further comprising:
means for providing an initial individual antenna element frequency; and
means for determining at least one resonant mode frequency based on the initial individual antenna element frequency and the at least one magnetic coefficient of coupling.

80. The system of claim 79, wherein the means for determining at least one resonant mode frequency includes utilizing a circuit theory for a bird-cage resonator.

81. The system of claim 79, further comprising:
means for determining an initial principal resonant mode frequency based on the initial individual antenna element frequency and the at least one magnetic coefficient of coupling; and
means for determining a final individual antenna element frequency based on the initial principal resonant mode frequency.

82. The system of claim 81, wherein the final individual antenna element frequency is the initial individual antenna element frequency when the initial principal resonant mode frequency is equal to a desired Larmor frequency.

83. The system of claim 81, wherein the final individual antenna element frequency is a scaled adjustment of the initial individual antenna element frequency when the initial principal resonant mode frequency is not equal to a desired Larmor frequency.

84. The system of claim 81, further comprising:
means for determining a capacitance value of a capacitance applied to the ends of the antenna elements based on the final individual antenna element frequency.

85. The system of claim 84, wherein the capacitance is selected from a group including a lumped element capacitance and a distributed capacitance.

86. The system of claim 76, wherein the self inductance, the at least one mutual inductance, and the at least one magnetic coefficient of coupling are determined by approximating a three-dimensional magnetic field generated within the RF coil assembly to be a two-dimensional magnetic field in a transverse direction.

87. The system of claim 76, wherein the means for determining a self inductance is configured to determine numerical values of a magnetic vector potential by solving the two-dimensional boundary value problems for a transverse cross-sectional area inside the RF coil assembly.

88. The system of claim 87, wherein the means for determining a self inductance is configured to determine the amount of magnetic flux intercepted between a surface of any one of the antenna elements and an inner circumferential surface of the shield.

89. The system of claim 87, wherein the means for determining a self inductance is configured to determine a difference between the numerical values of the magnetic vector potential at a surface of any one of the antenna elements and at an inner circumferential surface of the shield.

90. The system of claim 87, wherein the means for determining a self inductance includes taking into account the number of flux lines between a surface of any one of the antenna elements and at an inner circumferential surface of the shield, the flux lines presented at select intervals of the magnetic vector potential inside the transverse cross-section of the RF coil assembly.

91. The system of claim 76, wherein the self inductance is a self inductance per unit length of the antenna elements and the self inductance associated with each of the antenna elements is the same due to the rotational symmetry of the RF coil assembly.

92. The system of claim 76, wherein the means for determining at least one mutual inductance is configured to determine numerical values of a magnetic vector potential for a transverse cross-sectional area inside the RF coil assembly by solving the two-dimensional boundary value problems with the one of the antenna elements being excited by a current the remaining antenna elements being quiescent.

93. The system of claim 92, wherein the mutual inductance associated with the one and the another of the antenna elements is the amount of magnetic flux passing between the another of the antenna elements and the shield.

94. The system of claim 92, wherein the mutual inductance associated with the one and the another of the antenna elements is a difference between the numerical values of the magnetic vector potential at a surface of the anther of the antenna elements and at an inner circumferential surface of the shield.

95. The system of claim 92, wherein the two-dimensional boundary value problems are analytically solved.

96. The system of claim 76, wherein the means for determining at least one mutual inductance is configured to determine numerical values of a magnetic vector potential for a transverse cross-sectional area inside the RF coil assembly by solving the two-dimensional boundary value problems with only the one of the antenna elements assumed to be present and excited within the RF coil assembly.

97. The system of claim 96, wherein the means for determining at least one mutual inductance is further configured to assume all of the antenna elements are present within the RF coil assembly after the two-dimensional boundary value problems have been solved and further comprising means for providing an imaginary perimeter around all of the antenna elements.

98. The system of claim 97, wherein the imaginary perimeter has a radius equal to a radius of a bolt circle included in each of the annular members plus a radius of any of the antenna elements.

99. The system of claim 97, wherein the shape of the imaginary perimeter is the same as the transverse cross-sectional shape of the shield.

100. The system of claim 97, wherein the means for providing an imaginary perimeter provides the imaginary perimeter tangent to a side of each of the antenna elements that is closest to an inner circumference of the shield.

101. The system of claim 100, wherein the mutual inductance associated with the one and the another of the antenna elements is a difference in the magnetic vector potential at the tangency point of the another of the antenna elements to the imaginary perimeter and at a closed inner circumferential point of the shield.

102. The system of claim 76, wherein the RF coil assembly includes an n number of the antenna elements and further comprising means for determining (n/2) mutual inductances associated with the one of the antenna elements and each of the remaining (n/2) antenna elements that are to the left or right of the one of the antenna elements by solving analytically or numerically the two-dimensional boundary value problems.

103. The system of claim 102, further comprising means for determining (n–1) magnetic coefficients of coupling associated with the one of the antenna elements and each of the remaining (n–1) antenna elements, wherein an ith magnetic coefficient of coupling is equal to the ith mutual inductance divided by the self inductance.

104. The system of claim 76, wherein the means for determining the self inductance and the mutual inductance are configured to solve the two-dimensional boundary value problems to generate numerical values of a magnetic vector potential within a transverse cross-sectional area of the RF coil assembly when at least one of the antenna elements is present and excited within the RF coil assembly.

105. The system of claim 104, wherein an analytical expression of a magnetic flux associated with the magnetic vector potential within the transverse cross-sectional area of the RF coil assembly is a stream function.

106. The system of claim 105, wherein the stream function includes a parameter a associated with geometry parameters of the RF coil assembly.

107. The system of claim 106, wherein the parameter $\alpha$ is generated by analytical or numerical solution of a system of transcendental equations.

108. The system of claim 76, wherein the mutual inductance is a mutual inductance per unit length of the antenna elements.

109. The system of claim 76, wherein the RF coil assembly is a transverse electromagnetic (TEM) resonator.

110. The system of claim 76, wherein the antenna elements include conductive material and each of the antenna elements has a cross-sectional shape selected from a group including circular, elliptical, square, rectangular, and a variety of other shapes.

111. The system of claim 76, wherein each of the antenna elements has a uniform cross-section along its entire length.

112. The system of claim 76, wherein a numerical solution of the two-dimensional boundary value problems include using a methodology selected from a group including a method of moments, a method of finite elements, and a variety of other methodologies.

113. A method of designing a radio frequency (RF) coil assembly having a plurality of antenna elements captured between two annular members and encircled by a shield, comprising the steps of:
specifying geometry parameters associated with the RF coil assembly to be designed;
determining a self inductance associated with any one of the antenna elements by solving two-dimensional boundary value problems;
determining mutual inductances between the antenna elements by solving two-dimensional boundary value problems;
determining magnetic coefficients of coupling using the self inductance and the mutual inductances;
determining an individual antenna element frequency corresponding to a principal resonant mode frequency that is equal to a desired Larmor frequency; and
determining a capacitance value of a capacitance applied to the ends of the antenna elements.

114. The method of claim 113, wherein the two-dimensional boundary value problems are solved analytically or numerically.

115. The method of claim 114, wherein methodology to solve the two-dimensional boundary value problems is selected from a group including a method of moments, a method of finite elements, and a variety of other methods.

116. The method of claim 113, wherein specifying geometry parameters include specifying at least one of a radius, a diameter, or dimensions of the cross-section of the antenna elements; a radius or a diameter of a bolt circle included in each of the annular members; a radius or a diameter of the shield; and the number of antenna elements.

117. The method of claim 113, wherein determining a self inductance and determining mutual inductances includes approximating a three-dimensional magnetic field generated within the RF coil assembly to be a two-dimensional magnetic field in a transverse direction.

118. The method of claim 113, wherein determining a self inductance includes determining numerical values of a magnetic vector potential by solving the two-dimensional boundary value problems for a transverse cross-sectional area inside the RF coil assembly.

119. The method of claim 118, wherein determining a self inductance includes determining the amount of a magnetic flux intercepted between a surface of any one of the antenna elements and an inner circumferential surface of the shield.

120. The method of claim 113, wherein determining mutual inductances include determining numerical values of a magnetic vector potential by solving the two-dimensional boundary value problems for a transverse cross-sectional area inside the RF coil assembly.

121. The method of claim 120, wherein determining numerical values of a magnetic vector potential include assuming only one of the antenna elements is present and excited within the RF coil assembly.

122. The method of claim 121, wherein determining mutual inductances include assuming all of the antenna elements are present within the RF coil assembly after the two-dimensional boundary value problems have been solved and providing an imaginary perimeter around all of the antenna elements.

123. The method of claim 120, wherein determining mutual inductances include determining the amount of a magnetic flux intercepted between a surface of each of the antenna elements and an inner circumferential surface of the shield.

124. The method of claim 113, wherein determining magnetic coefficients of coupling includes calculating ratios of the self inductance and the mutual inductances.

125. The method of claim 113, wherein determining an individual antenna element frequency includes a selective scaled adjustment to an initial individual antenna element frequency to generate the individual antenna element frequency when the principal resonant mode frequency is not initially equal to the desired Larmor frequency.

126. The method of claim 113, wherein the RF coil assembly includes an n number of antenna elements and wherein determining mutual inductances include determining n/2 number of possibly unique mutual inductances to define all of the mutual inductances associated with the antenna elements, due to a rotational symmetry of the RF coil assembly.

127. The method of claim 113, wherein determining a capacitance value includes determining the capacitance value as a function of the individual antenna element frequency.

128. The method of claim 113, wherein the RF coil assembly is a transverse electro-magnetic (TEM) resonator.

129. A method of making a radio frequency (RF) coil assembly, having a central longitudinal axis, for magnetic resonance (MR) imaging or spectroscopy, the comprising the steps of:
providing n antenna elements concentrically positioned within a shield, a longitudinal axis of each of the n antenna elements and of the shield in parallel with the central longitudinal axis;
providing a pair of annular members coupled to both ends of the n antenna elements, each of the annular members including a bolt circle; and
providing a capacitance at each end of the n antenna elements;
determining a capacitance value of the capacitance by calculating magnetic coefficients of coupling and an individual antenna element frequency using two-dimensional boundary value problems and a circuit theory of a bird-cage resonator, at least one of the magnetic coefficients of coupling and the individual antenna element frequency functions of physical dimensions of the antenna elements, the shield, and the annular members; and
wherein the assembly operates at a principal resonant mode frequency that is approximately equal to a desired Larmor frequency.

130. The method of claim 129, wherein the physical dimensions include a radius, a diameter, or dimensions of the cross-section of the antenna elements; a radius or a diameter of the bolt circle of the annular members; a radius or a diameter of the shield; and the number of antenna elements.

131. The method of claim 129, wherein an ith magnetic coefficient of coupling is a ratio of a self inductance and an ith mutual inductance, where i=1 to (n−1).

132. The method of claim 131, wherein the self inductance is the amount of magnetic flux intercepted between a surface of any one of the antenna elements and an inner circumferential surface of the shield.

133. The method of claim 131, wherein each of the self inductance and the mutual inductances are determined from numerical values of a magnetic vector potential for a transverse cross-sectional area inside the assembly.

134. The method of claim 133, wherein the self inductance is a difference between the numerical values of the magnetic vector potential at a surface of any one of the antenna elements and at an inner circumferential surface of the shield.

135. The method of claim 131, wherein the self inductance is the number of flux lines between a surface of any one of the antenna elements and at an inner circumferential surface of the shield, the flux lines presented at select intervals of the magnetic vector potential.

136. The method of claim 131, wherein the ith mutual inductance is the amount of magnetic flux between a surface of the ith antenna element and an inner circumferential surface of the shield, approximating the remaining antenna elements as being quiescent or absent.

137. The method of claim 129, wherein the two-dimensional boundary value problems are solved analytically or numerically.

138. The method of claim 129, wherein an analytical expression of a magnetic flux associated with a magnetic vector potential within the transverse cross-sectional area of the assembly is a stream function including a parameter a that is a function of the physical dimensions.

139. The method of claim 129, wherein the assembly is a transverse electro-magnetic (TEM) resonator.

140. The method of claim 129, wherein the antenna elements include conductive material and each of the antenna elements has a cross-sectional shape selected from a group including circular, elliptical, square, rectangular, and a variety of other shapes.

141. The method of claim 129, wherein each of the antenna elements has a uniform cross-section along its entire length.

142. The method of claim 129, wherein the capacitance is selected from a group including a lumped element capacitance and a distributed capacitance.

* * * * *

UNITED STATES PATENT AND TRADEMARK OFFICE
CERTIFICATE OF CORRECTION

PATENT NO.    : 6,535,084 B1
DATED         : March 18, 2003
INVENTOR(S)   : Tropp It is certified that error appears in the above-identified patent and that said Letters Patent is hereby corrected as shown below:

<u>Column 16,</u>
Line 44, please add the attached Appendix, pages 1-6.

APPENDIX

```
% Copyright © Unpublished by General Electric Company
% All Rights Reserved
%
% TEMMODES.M
% A matlab script to calculate the spectrum of a
% TEM resonator, taking account of mutual
% inductances, which are calculated as coefficients of coupling
% between meshes, by the script tempack.m, called herein as
% subroutine. Temmodes itself is derived from a freestanding
% 'parent' script -- generalbird.m -- which accounts for the presence
% of some inessential (vestigial) conditionals.

% clear workspace clear

% global variables allow script to call tempack.m -- a front end for calculating
% mode frequencies from geometry for tem resonator.

global ksi global n_mesh global circular global lowpass global OMA2 n_mesh = input('enter the number of meshes')  % number of meshes
circular = 1 %input('enter "1" for round coil, or "0" for flat')
lowpass =  0 %input('enter "1" for lo-pass/hybrid, or "0" for hi-pass')  % lowpass
OMA2 = input('enter the single mesh frequency (MHz)');

% call tempack.m, which provides the coupling coefficients, ksi
tempack

%  set aside these couplings for other tests if necessary
ksi_data = ksi;

%###double all ksi except last####%
for m = 1: ((n_mesh/2)-1);
        ksi(m) = 2*ksi(m);
end;
ksi(n_mesh/2) = ksi(n_mesh/2);
ksi;

% cosine array for denominator
```

UNITED STATES PATENT AND TRADEMARK OFFICE
CERTIFICATE OF CORRECTION

PATENT NO. : 6,535,084 B1  
DATED : March 18, 2003  
INVENTOR(S) : Tropp

Page 2 of 6

It is certified that error appears in the above-identified patent and that said Letters Patent is hereby corrected as shown below:

```
M = 1:n_mesh/2;
K = 1:n_mesh;

COS1 = cos(2*pi*K'*M/n_mesh);

COS1;

% setup denominator
M1 = ones(n_mesh,1);
DEN= COS1*ksi'+M1;
DEN;
% setup numerator if lowpass == 1
        NUME = (M1 + 0.5*C1_over_C2*M1 - COS1(:,1));
        elseif lowpass == 0
        NUME = M1;
end for m=1:n_mesh;
        omega2(m) = OMA2*OMA2*NUME(m)/DEN(m);
        omega1(m) = sqrt(omega2(m));
end;
output = [omega1(n_mesh) omega1(1:n_mesh/2)]';
%for m=1:5;
        %omega(m) = omega1(9-m);
%end;

newout = zeros(length(output),2);
newout(:,1) = output; newout(1:(length(ksi)),2) = ksi_data'

% Extra code put in with an eye towards extracting coupling coefficients
COS2 = cos(2*pi*K'*K/n_mesh);

% COS2 can be used to generate DEN, by multiplying with a vector derived
% from ksi_orig as follows: vector = [ksi_orig, ksi_orig_rev 1],
% where ksi_orig_rev is just ksi_orig with its elements swapped so
% as to run high to low, rather than low than high (in index).

% COS2 times itself is a kind of inverse transform, so that
% COS2*COS2*ksi_orig_rev just returns ksi_orig_rev.[0.12716 0.0497 0.02046 0.015526
0.008 0 0 0] 0.1183

%%%%%********%%%%%%

% TEMPACK.M
% Script for design of TEM resonators: it comprises several
% pieces, including a 'prep' stage (digesting the geometric
% specification), and two stages of subsequent calculation
```

UNITED STATES PATENT AND TRADEMARK OFFICE
CERTIFICATE OF CORRECTION

PATENT NO.    : 6,535,084 B1                                           Page 3 of 6
DATED         : March 18, 2003
INVENTOR(S)   : Tropp It is certified that error appears in the above-identified patent and that said Letters Patent is hereby corrected as shown below:

```
% Prep %
% First take the radii and center to center distance of
% equipotential cylinders, and solve therefrom for the relative
% potentials and the distance "a" by which the line sources are
% offset from the origin -- all arising from the well known 2D
% potential problem of a pair of line sources, be they current or
% charge.

%%%%%%%% for its determination, "a" is allowed to vary %%%%%%
%% let "a" assume a range of values between .1 and 4 cm (1 cm = 0.01 m) %%

% For reference: a set of values for 3 T head coil:
% R1 = 17.78; R2 = 0.3175; D = 14.605

% clear workspace?  This is quite tricky clear global ksi global n_mesh global n_rod global circular global lowpass global OMA2 global a_corr            % parameter "a" for placement of image currents global center1_corr % center of shield global center2_corr      % center of conductive rod global D                 % distance between centers of shield and rod in cm.

global R1_mag % outer shield radius in cm.

global R2_mag   % conductive rod radius in cm.

aa = (2:.001:10)*.01;    % this severely limits the range of calculable "a"
R1_mag = input('Give the outer shield radius in cm.')
R1 = R1_mag*ones(size(aa))*.01; % R1 is radius of large circle in M
% set up a vector of this constant
```

UNITED STATES PATENT AND TRADEMARK OFFICE
CERTIFICATE OF CORRECTION

PATENT NO.    : 6,535,084 B1
DATED         : March 18, 2003
INVENTOR(S)   : Tropp It is certified that error appears in the above-identified patent and that said Letters Patent is hereby corrected as shown below:

```
R2_mag = input('Give the radius of the rod, in cm.')
R2 = R2_mag*ones(size(aa))*.01;

D = input('What is the center to center distance (cm), between rod and shield?')
D = D* 0.01; %convert to meters % check to see if # of rods is supplied by a calling program;
% if so, notify user; if not, request the number if isempty(n_mesh)
        n_rod = input('Give the number of resonant elements (rods).')
        else
        fprintf(1, 'tempack reading # rods from calling program temmodes.\n\n')
        n_rod = n_mesh;
end fprintf(1, 'number of rods = %g\t',n_rod)
fprintf(1, 'single mesh freq = %g\n',OMA2)
fprintf(1, 'shield radius = %g\t',R1_mag)
fprintf(1, 'bolt circle = %g\t',D*100)
fprintf(1, 'rod radius = %g\n\n',R2_mag)

% generate sinh of surface potentials (psi's) on the two cylinders,
%from distance data over the "test range" of a.

sh_psi1 = aa./R1;      % sinh(psi1) = a/R1; generates range permissible values
sh_psi2 = aa./R2;      % sinh(psi2) = a/R2; "     " ....
%%%%%%%%

% extract the potentials at from the sinh values
% from the extracted potentials (psi1 and psi2)
% calculate the pieces needed for the center to center distances
% of the two circles (large and small).

psi1 = asinh(sh_psi1);
psi2 = asinh(sh_psi2);
%%%%%%%%%%

% Generate coth values of psi's, needed for calculation of
% center to center distances (of the the two equipot surfaces)
% and calculate a range of permissible distances, based on the
% above-chosen range of "a"

DP1 = abs(coth(psi1));
DP2 = abs(coth(psi2));
duff = DP1 - DP2;
dist = aa.*duff;
%%%%%%%%%

% Select, from the range of possible distances, that which approaches
```

UNITED STATES PATENT AND TRADEMARK OFFICE
CERTIFICATE OF CORRECTION

PATENT NO. : 6,535,084 B1  
DATED : March 18, 2003  
INVENTOR(S) : Tropp

Page 5 of 6

It is certified that error appears in the above-identified patent and that said Letters Patent is hereby corrected as shown below:

```
% most nearly the actual specified distance.

%test = (abs(dist-28.21*0.01)) = = min(abs(dist - D));
test =(abs(dist - D)) = = min(abs(dist - D));

%%%%%
% Then,using the peculiar vectorized conditional testing features
% of Matlab, extract and print the appropriate values of all parameters.

%* NOTE!! SEVERAL PRINTOUTS CANCELLED FOR BREVITY! PUT IN BRIEF
REPORT
%* OPTION LATER!! DON'T DELETE!!
psi1_corr = psi1(test);
psi1_print = psi1(test)*2*1e-7;
%%* fprintf(1, 'The flux (per meter) on the shield is: %d\n\n',psi1_print)

psi2_corr = psi2(test);
psi2_print = psi2(test)*2*1e-7;
%%*fprintf(1, 'The flux (per meter) on the isolated rod is: %d\n\n',psi2_print)

%correct "a" value
a_corr = aa(test);
a_print = 100* a_corr;
fprintf(1, 'The offset value "a" (in cm) is: %d\n\n',a_print)
% the two correct coth values
coth1_corr = DP1(test);
coth2_corr = DP2(test);
% and the centers of the two circles center1_corr = DP1(test)*aa(test);
center1_print = 100*center1_corr;
fprintf(1, 'The center of the shield is (in cm) is: %d\n\n',center1_print)
%fprintf(1, 'The center of the rod (in cm) is:')
center2_corr = DP2(test)*aa(test);
center2_print = center2_corr*100;
fprintf(1, 'The center of the rod (in cm) is: %d\n\n',center2_print)

flux = psi2_corr - psi1_corr;
flux_print = flux*2*1e-7;
%%*fprintf(1, 'The inductance per meter is: %d\n\n',flux_print)

% End of prep stage %

% Now pass to calculation of coefficients of coupling

% calculate the flux constants on the 'bolt circle' defined by
% by the outer periphery of the legs, for a TEM coil with
% R1 = 17.78 cm, R2 = 0.3175 cm and D = 14.605 cm % set up radial point array
radius = (D + R2_mag*.01)*exp(i*2*pi*(0:(n_rod - 1))/n_rod);
```

UNITED STATES PATENT AND TRADEMARK OFFICE
CERTIFICATE OF CORRECTION

PATENT NO. : 6,535,084 B1
DATED : March 18, 2003
INVENTOR(S) : Tropp

It is certified that error appears in the above-identified patent and that said Letters Patent is hereby corrected as shown below:

```
place_2 = ones(size(radius));
offset = 0.00000001*place_2;   % offset, against division by zero
a_mut = a_corr*place_2;   % the "a" value 0.0350 is determined elsewhere
placeholder_2 = center1_corr*place_2;   % 18.12 cm is center of big circle
numb = radius + a_mut + placeholder_2 + offset;
denn = radius - a_mut + placeholder_2 + offset;
argh = abs(numb./denn);
handswer = (log(argh) - psi1_corr*ones(size(argh)))./(flux);

% generate array of coupling coefficients for possible use by
% temmodes.m
start =( n_rod/2) + 2;
 ksi = [handswer(start:n_rod) handswer(1)];
```

Signed and Sealed this

Eighteenth Day of November, 2003

JAMES E. ROGAN
*Director of the United States Patent and Trademark Office*